(12) United States Patent
Ominami et al.

(10) Patent No.: US 9,472,375 B2
(45) Date of Patent: Oct. 18, 2016

(54) CHARGED PARTICLE BEAM DEVICE, SAMPLE STAGE UNIT, AND SAMPLE OBSERVATION METHOD

(71) Applicant: Hitachi High-Technologies Corporation, Minato-ku, Tokyo (JP)

(72) Inventors: Yusuke Ominami, Tokyo (JP); Mami Konomi, Tokyo (JP); Shinsuke Kawanishi, Tokyo (JP); Hiroyuki Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/443,293

(22) PCT Filed: Nov. 21, 2013

(86) PCT No.: PCT/JP2013/081411
§ 371 (c)(1),
(2) Date: May 15, 2015

(87) PCT Pub. No.: WO2014/080987
PCT Pub. Date: May 30, 2014

(65) Prior Publication Data
US 2015/0311033 A1    Oct. 29, 2015

(30) Foreign Application Priority Data

Nov. 21, 2012  (JP) .................................. 2012-254835

(51) Int. Cl.
*G21K 5/04* (2006.01)
*H01J 37/26* (2006.01)
(Continued)

(52) U.S. Cl.
CPC ................ *H01J 37/20* (2013.01); *H01J 37/16* (2013.01); *H01J 37/224* (2013.01); *H01J 37/28* (2013.01);
(Continued)

(58) Field of Classification Search
USPC ......... 250/396 R, 397, 492.1, 492.2, 492.21, 250/492.22, 492.23, 492.3
See application file for complete search history.

(56) References Cited

U.S. PATENT DOCUMENTS

2004/0046120 A1   3/2004  Moses et al.
2004/0076529 A1*  4/2004  Gnauck ................. F04D 19/046
                                                                 417/250

(Continued)

FOREIGN PATENT DOCUMENTS

JP   59-146145 A    8/1984
JP   2004-515049 A  5/2004

(Continued)

OTHER PUBLICATIONS

German Office Action dated Jun. 2, 2015, with partial English translation (nine (9) pages).

(Continued)

*Primary Examiner* — Nicole Ippolito
(74) *Attorney, Agent, or Firm* — Crowell & Moring LLP

(57) ABSTRACT

A charged particle beam device provided with: a charged particle optical lens column generating a primary charged particle beam; a housing which has its inside evacuated by a vacuum pump; a first diaphragm that forms a part of the housing and able to keep an airtight state of the interior space of the housing; and a second diaphragm disposed between the first diaphragm and the sample, wherein a primary charged particle beam generated by the charged particle optical lens column is transmitted by or passes through the first diaphragm and the second diaphragm, and then is irradiated, on the sample that is in contact with the second diaphragm.

15 Claims, 15 Drawing Sheets

(51) Int. Cl.
*H01J 37/20* (2006.01)
*H01J 37/16* (2006.01)
*H01J 37/28* (2006.01)
*H01J 37/22* (2006.01)

(52) U.S. Cl.
CPC . *H01J 2237/2002* (2013.01); *H01J 2237/2003* (2013.01); *H01J 2237/2004* (2013.01); *H01J 2237/2608* (2013.01); *H01J 2237/28* (2013.01)

(56) References Cited

U.S. PATENT DOCUMENTS

| | | | |
|---|---|---|---|
| 2009/0166536 A1 | 7/2009 | Suga et al. | |
| 2010/0148087 A1* | 6/2010 | Doering | B82Y 10/00 250/396 R |
| 2010/0243888 A1 | 9/2010 | Nishiyama et al. | |
| 2011/0284745 A1 | 11/2011 | Nishiyama et al. | |
| 2014/0021347 A1 | 1/2014 | Ominami et al. | |
| 2014/0123898 A1* | 5/2014 | Nomaguchi | H01J 37/18 118/723 FI |
| 2015/0014530 A1* | 1/2015 | Ominami | H01J 37/16 250/311 |

FOREIGN PATENT DOCUMENTS

| | | |
|---|---|---|
| JP | 2007-113952 A | 5/2007 |
| JP | 2008-47411 A | 2/2008 |
| JP | 2008-218342 A | 9/2008 |
| JP | 2009-158222 A | 7/2009 |
| JP | 2011-243483 A | 12/2011 |
| WO | WO 2010/001399 A1 | 1/2010 |
| WO | WO 2012/140822 A1 | 10/2012 |

OTHER PUBLICATIONS

International Search Report (PCT/ISA/210) dated Jan. 14, 2014, with English translation (Five (5) pages).
Japanese language Written Opinion (PCT/ISA/237) dated Jan. 14, 2014 (Five (5) pages).

* cited by examiner

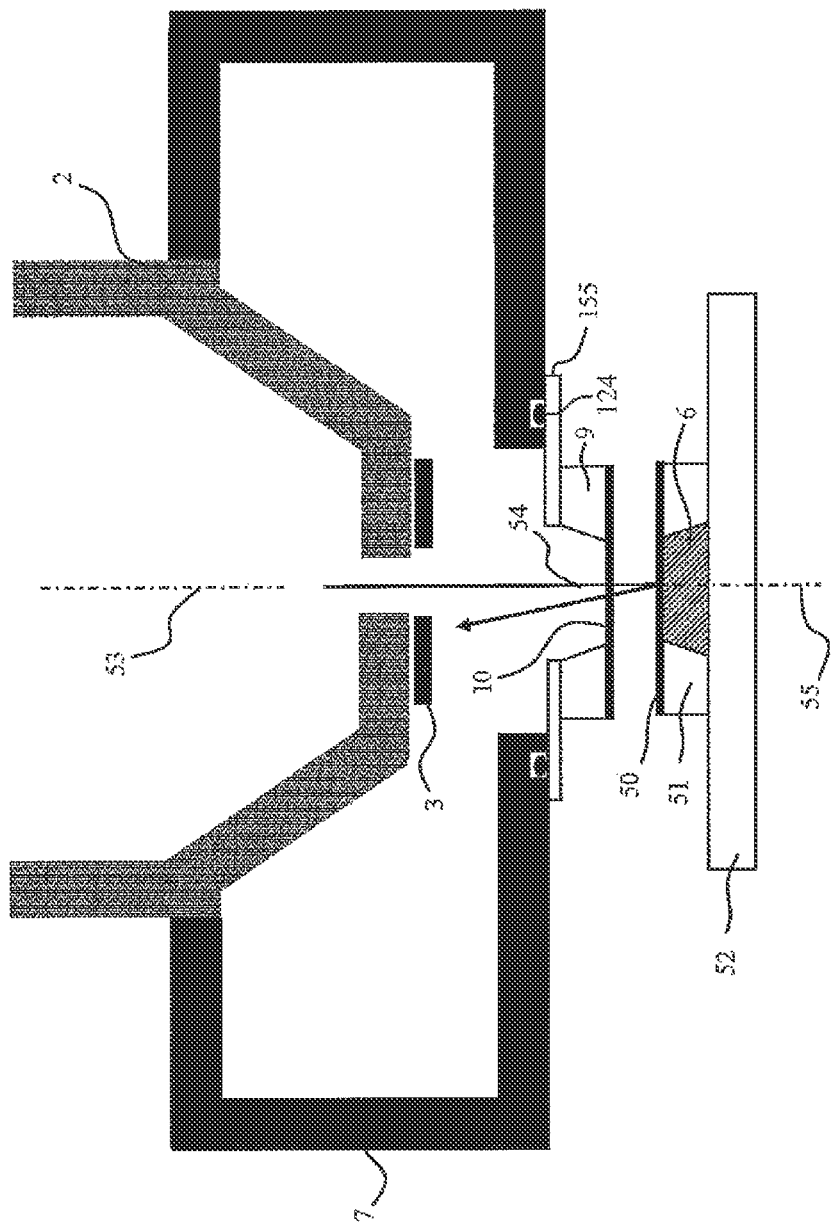

CHARGED PARTICLE BEAM DEVICE, SAMPLE STAGE UNIT, AND SAMPLE OBSERVATION METHOD

CROSS-REFERENCE TO RELATED APPLICATIONS

The present application relates to and claims priority from Japanese patent application No. 2012-254835, filed on Nov. 21, 2012. The entirety of the contents and subject matter of all of the above is incorporated herein by reference.

TECHNICAL FIELD

The present invention relates to a charged particle beam device that enables an observation of a sample in a predetermined gas atmosphere under one air pressure or a little lower pressure than one air pressure.

BACKGROUND ART

To observe a microscopic image of an object, a microscope such as a scanning electron microscope (SEM) or a transmission electron microscope (TEM) is used. In general, these microscopes have a housing which accommodates a sample evacuated to capture an image of the sample under a vacuum state. However, the vacuum state may damage a sample such as a biochemical sample or a liquid sample, or change a state of the sample. On the contrary, there are large needs for observing such samples using an electron microscope, and in recent years, a device such as an SEM and a sample holder that enables the observation of a target sample at one air pressure has been developed.

In principle, these devices have an electron-beam-transmittable diaphragm between an electron optical system and the sample to partition the housing into a vacuum space and an atmospheric space. Therefore, these devices have a common configuration which has the diaphragm between the electron optical system and the sample.

For example, Patent Literature 1 discloses an SEM that includes an electronic optical lens column provided with an electron source thereof arranged at a lower side and an objective lens arranged at an upper side, and a diaphragm which is able to transmit an electron beam via an O-ring on an electron-beam-emitting aperture at an end of the electronic optical lens column. The invention described in the Patent Literature 1 places the liquid containing an observed sample directly on the diaphragm, irradiates a primary electron beam on the lower surface of the sample, and detects reflected electrons or secondary electrons to perform the SEM observation. The sample is held in a space defined by the diaphragm and an annular member disposed around the diaphragm, and further this space is filled with a liquid such as water.

CITATION LIST

Patent Literature

Patent Literature 1: Japanese Patent Publication No. 2009-158222 (the counterpart US Patent Publication No. 2009-0166536).

SUMMARY OF INVENTION

Technical Problems

The conventional SEM device and sample holder have a common configuration in which the sample and the diaphragm are in contact with each other. Therefore, it is necessary to replace the diaphragm separating the vacuum and the atmosphere each time the sample is replaced.

For example, the SEM of Patent Literature 1 needs to have the annular member having the diaphragm with a sample mounted thereon removed when exchanging the sample, and to have a vacuum state of the charged particle optical lens column 2 changed to an atmospheric state. Therefore, the Patent Literature 1 fails to provide the SEM device that is able to exchange the sample at high throughput.

Moreover, even a method of observing the sample in a non-contact with the diaphragm requires the replacement of the diaphragm each time of exchanging the sample, because if the sample is liquid, a natural state of the sample generates the surface tension, which causes a nonparallel state between a surface of the sample and the diaphragm and prevents the sample from being observed unless the diaphragm and the sample are moved close to an extent that they contact with each other.

The present invention was made to solve the above-mentioned problems and to provide a sample observation method and a charged particle beam device which enables a high-throughput exchange of samples placed in an atmosphere with, one air pressure or approximately the same pressure as the one air pressure.

Means for Solving the Problems

In order to solve the above problems, the present invention provides a sample observation method and a charged particle beam device that is provided with a first diaphragm, being able to keep an airtight state of a housing evacuated and to allow a primary charged particle beam to be transmitted by or pass through the first diaphragm, and a second diaphragm that is placed between the first diaphragm and a sample and allows the primary charged particle beam to be transmitted by or pass through the second diaphragm, and irradiates the primary charged particle beam on the sample through the second diaphragm.

Effect of the Invention

The present invention is able to provide a sample observation method and a charged particle beam device that enables a high-throughput exchange of a sample that is placed, in an atmosphere with one air pressure or substantially the same pressure.

Problems, configurations, and effects other than the above are specified by descriptions of embodiments below.

BRIEF DESCRIPTION OF DRAWINGS

FIG. 3 is a detailed view of a vicinity of a diaphragm, the sample, and a detector.

DESCRIPTION OF EMBODIMENTS

Each Embodiment is now described with reference to the drawings.

In the below, a charged particle beam microscope is described as an example of a charged particle beam device. However, this is merely an exemplary device of the present invention, and the invention is not intended to be limited to the embodiments described below. The present invention can be applied to a device such as a scanning electron microscope, a scanning ion microscope, a scanning-transmitting electron microscope, a composite device thereof with a sample processing device, and an analysis or inspection device that is an application of the above devices.

The term "one air pressure" as used herein means a pressure environment of an aerial or a predetermined-gas atmosphere, that is, one air pressure or a slightly lower pressure than the one air pressure, specifically from approximately $10^5$ Pa (one air pressure) to approximately $10^3$ Pa.

Embodiment 1

Device Configuration

Figure 1:
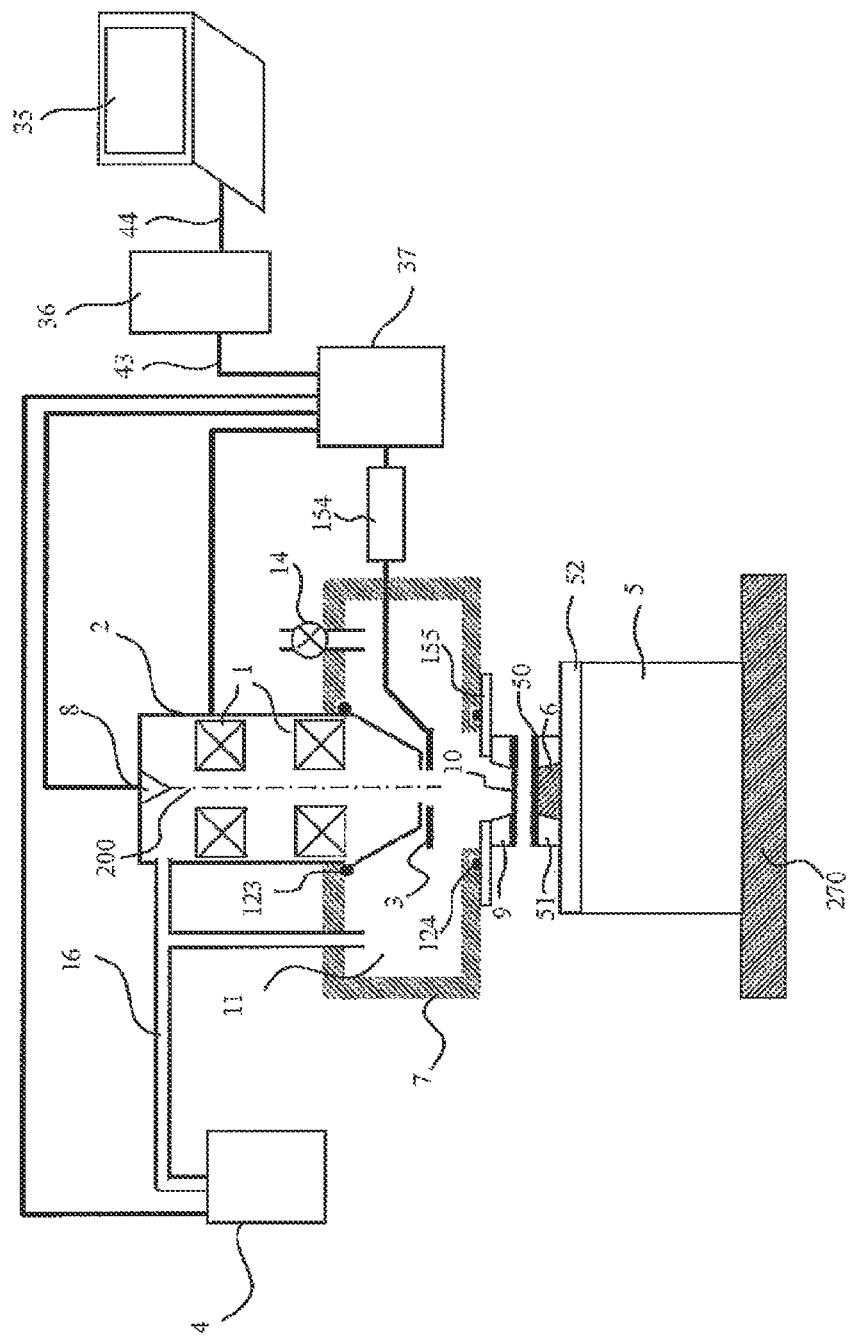
FIG. 1 is a view of a general configuration of a charged, particle microscope according to Embodiment 1.

This embodiment describes an example with a basic structure, FIG. 1 shows a view of a general configuration of a charged particle microscope according to this embodiment.

The charged particle microscope shown in FIG. 1 includes mainly a charged particle optical lens column 2, a housing (vacuum chamber) 7 being connected with and supporting the charged particle optical lens column 2, a sample stage 5 placed in an aerial atmosphere, and a control system controlling the above components. When using the charged particle microscope, the internal spaces of the charged particle optical lens column 2 and the housing 7 are evacuated by a vacuum pump 4. The start and stop operation of the vacuum pump 4 are also controlled by the control system. FIG. 1 shows only one of the vacuum pumps 4, but two or more vacuum pumps may be provided. The charged particle optical lens column 2 and the housing 7 are assumed to have pillars or the like (not shown) supported by a stand 270.

The charged, particle optical lens column 2 includes components such as a charged particle beam source 8 for generating a charged particle beam and a optical lens 1 for focusing and guiding the charged particle beam generated to the bottom thereof and scanning the sample 6 using the charged, particle beam guided as a primary charged, particle beam. The charged particle optical lens column 2 is installed in a manner of protruding into an inner space of the housing 7, and fixed, to the housing 7 through a vacuum-sealing member 123. At the end of the charged particle optical lens column 2 is arranged a detector 3 for detecting a secondary charged particle (secondary electron or reflected electron) obtained by irradiation of the primary charged particle beam.

The charged particle microscope according to the present embodiment includes, for a control system, a computer 35 used by a device user, a higher-level controller 36 connected to the computer 35 and performing communication, and a lower-level controller 37 for controlling systems such as an evacuation system and a charged particle optics system in accordance with instructions sent from the higher-level controller 38. The computer 35 is provided with a monitor that displays an operation window (GUI) of the device and input means into the operation window such as a keyboard and a mouse. The higher-level controller 36, the lower-level controller 37, and the computer 35, are connected to each other by communication lines 43 and 44.

The lower-level controller 37 is a unit for sending and receiving control signals for controlling components such as the vacuum pump 4, the charged particle beam source 8, and the optical lens 1, and further converting an output signal of the detector 3 into a digital image signal and sending the digital image to the higher-level controller 36. In FIG. 1, the output signal from the detector 3 passes through a signal amplifier 154 such as a preamplifier and comes to the lower-level controller 37. No amplifier may need to be installed if not necessary.

A higher-level controller 38 and a lower-level controller 37 may be mixed with different types of circuits such as an analogue and a digital circuit, or may be also unified into a single circuit. Note that the configuration of the control system shown in FIG. 1 is merely one example, and that modifications of parts such as the controller, a valve, the vacuum pump, and wiring for communication that implement functions that are specified in the present embodiment belong to the category of the SEM or the charged particle beam device described in the present embodiment.

The housing 7 is connected to a vacuum pipe 16 with one end connected to the vacuum pump 4, and thus is able to be kept vacuum therein. At the same time, the housing 7 includes a leak valve 14 to release an atmosphere therein, for example, for maintenance of the device. The leak valve 14 may be omitted, or two or more leak valves may be installed. Further, the leak valve 14 may not be limited to be arranged at a location shown in FIG. 1, but in another position of the housing 7.

On a bottom surface of the housing 7, a first diaphragm 10 is provided right beneath the charged particle optical lens column 2. The first diaphragm 10 is able to allow the primary charged particle beam emitted from the lower end of the charged particle optical lens column 2 to be transmitted by or pass therethrough. The primary charged particle beam passes through the first diaphragm 10 to finally reach the sample 6 mounted on a sample platform 52. Closed space formed by the first diaphragm 10 is able to be evacuated. Thus, in this embodiment, the evacuated space is kept airtight by the first diaphragm 10, which allows the charged particle optical lens column 2 to be kept in a vacuum state, and allows the sample 6 to be observed in the atmosphere kept at the one air pressure. In addition, during the observation, the sample 6 can be freely exchanged.

<First Diaphragm>

The first diaphragm 10 is film-formed or vapor-deposited on a stand 9. The first diaphragm 10 may be made of, for example, carbon material, organic material, metallic material, silicon nitride, silicon carbide, or silicon oxide. The stand 9 is a member made of, for example, silicon or metal material. The first diaphragm 10 may configured to have multi windows that are arranged in plural sections. The thickness of the diaphragm that is able to allow the primary charged particle beam to be transmitted or pass through is approximately from nanometers to micrometers. The first diaphragm needs to be able to avoid damage due to a pressure difference caused by separating a space into a one air pressure space and a vacuum space. Therefore, the area of the first diaphragm 10 is sized to approximately a square of dozens of micrometers at largest to millimeters. The shape of the first diaphragm 10 may be in any shape such as a rectangle, as well as a square.

The stand 9 supporting the first diaphragm 10 is provided on a diaphragm-holding member 155. Although not shown, the stand 9 may be bonded with the diaphragm-holding member 155 by an adhesive, a double-sided tape, or the like, which can be used for vacuum seal. The diaphragm-holding member 155 is interposed by a vacuum seal member 124 and detachably fixed on a lower surface of the housing 7. The first diaphragm 10 is very thin as approximately nanometers to micrometers thick in order to allow a charged particle beam to be transmitted, and therefore may be damaged due to aging deterioration or in preparing an observation. In addition, the first diaphragm 10 and the stand 9 for supporting thereof are difficult to directly handle if they are too small. Accordingly, as in this embodiment, the first diaphragm 10 and the stand 9 are unified with the diaphragm-holding member 155 and allowed to be handled through the diaphragm-holding member 155 instead of directly handling the stand 9, which makes it very easy to handle (especially exchange) the first diaphragm 10 and the stand 9. That is, when the first diaphragm 10 is damaged, replacing the whole of the diaphragm-holding member 155 may allow recover of the first diaphragm 10. Even if it should be necessary to replace directly the first diaphragm 10, it can be done by removing the whole of the diaphragm-holding member 155 to the outside of a device, and replacing each of the first diaphragm 10 and the stand 9 outside the device.

The space below the first diaphragm 10 provided in the housing 7 is provided with a sample stage 5 arranged in the atmosphere of one air pressure. The sample stage 5 is provided with at least a Z-axis driving feature having a height-adjusting function that enable the sample 6 to approach the diaphragm 10. It may be easily appreciated that the sample stage 5 may be provided, with an XY-axis driving feature which moves the sample in the direction flush with the sheet of this drawing.

<Second Diaphragm>

A stand 51 that is capable of being mounted with the sample 6 and provided with the second diaphragm 50 is arranged between the first diaphragm 10 and the sample stage 5. The sample 6 and the second diaphragm 50 are arranged on a sample platform on the sample stage 5. The second diaphragm 50 is supported by the stand 51. In other words, the sample 6 placed on the sample stage 5 has its surface (observation surface) covered by the second diaphragm 50. That is, the primary charged particle beam is irradiated on the sample which is in contact to the surface at the side near the sample platform (surface opposite to the surface facing the first diaphragm) of the second diaphragm 50. Accordingly, the second diaphragm 50 is configured to be detachable and to allow the charged particle beam to be transmitted by or pass through the second diaphragm 50.

The sample platform, the stands, and the second diaphragm, and the like are collectively referred to as "sample stage unit", which, may include only some of these elements.

In the embodiment described below, the preferred sample 6 may be a sample containing, for example, liquid such as aqueous solution, organic solvent, oil, sol, gel, or jelly; a biological or bio sample such as a cell, a bacterium, a blood cell, or a virus; or a sample mixed with nano/micro particles or nano-wires such as organic matter and metal. As used herein, "liquid" sample or "liquid-like" sample means, as exemplified above, a general name of whole of formless samples, that is, samples other than those having a solid surface. The description below takes such a liquid-like sample as an observation target, unless otherwise noted.

To observe a sample containing liquid, the liquid droplet of the sample placed on the sample platform can be directly observed. However, this approach has several problems described below. First, there is a problem that the liquid droplet having a spherical shape on the sample platform cannot be observed except at a tip portion of the droplet sample. This is because the mean free path of the charged particle beam in the air is too short for the charged particle beam to easily reach all over the droplet. Second, the droplets are so easily deformed in shape that even a little vibration is able to deform the shape of the droplet sample. Furthermore, there is a risk that the sample could accidentally contact with the first diaphragm 10 and break the first diaphragm 10 to enter inside the housing 7 which is in a vacuum state. These problems are likely to be solved by stretching the liquid sample into a thin droplet, but this solution makes the liquid-containing-sample dry. On the contrary, the method of arranging the second diaphragm 50 according to the present embodiment can reduce the possibility of droplet's drying at a maximum extent using the diaphragm which can transmit the charged particle beam, and can force the droplet shape to become flat, and therefore, can bring the sample near the first diaphragm very simply and with high throughput.

Figure 2A:
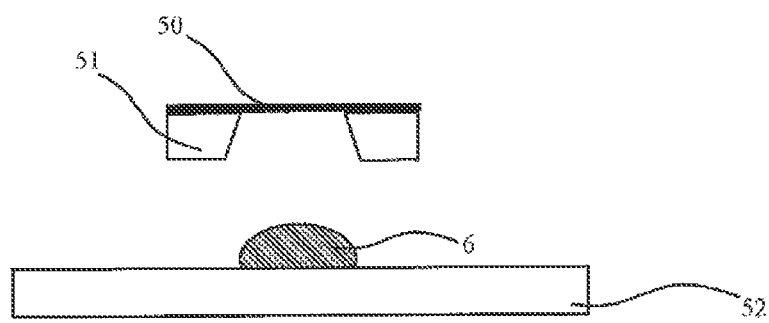
FIGS. 2A and 2B are detailed views of a method for mounting a sample.
Figure 2B:
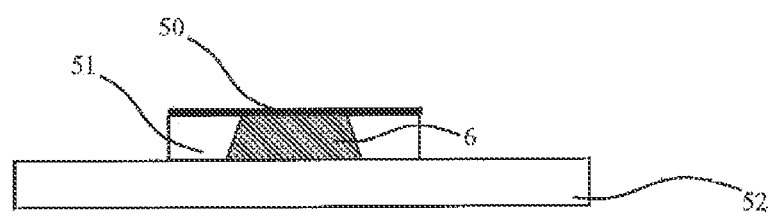

FIG. 2 shows a method of placing the sample using the second diaphragm 50. When the liquid-containing-sample 6 comes into contact to the lower surface of the second diaphragm 50, the sample shape becomes flat along the diaphragm surface. That is, the method is achieved, by steps of mounting the liquid-containing-sample 6 on the sample platform 52 by way such as dropping as described in FIG. 2A and mounting the stand 51 equipped with the second diaphragm 50 such that the sample 6 is positioned right beneath the second diaphragm 50 as shown in FIG. 2B. This enables the sample to be held in the space formed by the second diaphragm 50, the stand 51, and the sample platform 52 and the upper surface of the liquid-containing-sample 6 (surface irradiated by the primary charged particle beam) to be flat. Note that a hydrophilic material (not shown) may be applied or vapor-deposited on the lower surface of the second diaphragm 50 as viewed in FIG. 1 or on the sample platform 52 in order to enhance adhesion of the liquid-containing-sample 6. Because the second diaphragm 50 forces the observed surface of the liquid-containing-sample to be flat, it becomes easy to bring near the first diaphragm 10 and the second diaphragm 50. Additionally, the stand 51 may be several millimeters thick, or may be a very thin foil with thickness like hundreds of nanometers. The thickness of the second diaphragm 50 may cause no problems, as long as its shape is kept. In addition, no stand 51 may be provided, as long as only the shape of the sample is able to be controlled as described above.

Here, with reference to FIG. 3, a description is made of details of the vicinity of the first diaphragm 10 and the second diaphragm 50. This FIG. 3 is assumed that positions of an optical axis 53 of the charged particle optical lens column, a central axis 54 of the first diaphragm, and a central axis 55 of the second diaphragm are the same. In other words, these three axes are adjusted to accord with each other. The adjustment of the optical axis 53 of the charged particle optical lens column and the central axis 54 of the first diaphragm may be done by moving the diaphragm-holding member 155 in the horizontal direction in FIG. 3 and the direction perpendicular to the paper surface of FIG. 3. This movement may be done by using any jig, by manual operation, as well by providing an engagement such that the central shaft 54 of the first diaphragm accords with the optical axis 53 of the charged particle optical lens column when attaching the diaphragm-holding member 155. The adjustment of the central axis 54 of the first diaphragm and the central axis 55 of the second diaphragm can be done by operating the sample stage 5 holding the second diaphragm provided using the XY-axis driving feature equipped on the sample stage 5.

The primary charged particle beam emitted, from the charged, particle optical lens column is irradiated on the first diaphragm 10 through the interior space 11 of the housing 7. As described above, the first diaphragm 10 is so thin that the primary charged particle beam is transmitted or passes through the diaphragm. The primary charged particle beam that has been transmitted by or passed through the first diaphragm 10 passes through an atmospheric space between the first diaphragm 10 and the second diaphragm 50. The charged particle beam is scattered by the atmospheric space. The mean free path of the charged particle beam in the atmosphere depends on the energy of the charged particle beam, and ranges from several micrometers to one millimeter or less. Therefore, the distance between the first diaphragm 10 and the second diaphragm 50 is preferably as small as possible. The distance between the first diaphragm 10 and the second of diaphragm 50 can be decreased by regulating the Z-axis of the sample stage 5. Although not shown, a detection unit for electrically detecting a contact of the first diaphragm 10 with the second diaphragm 50 may be provided.

Next, the primary charged particle beam is irradiated on the second diaphragm 50. The second diaphragm 50 is thin enough, to transmit the primary charged particle beam similarly to the first diaphragm, and specifically approximately nanometers to micrometers thick. Additionally, the second diaphragm 50 is not required to separate the atmospheric space and the vacuum space, and therefore, is not required to be as strong as the first diaphragm 10. Therefore, the second diaphragm 50 can be further thinner than the first diaphragm 10 and also have a larger window area. The larger window area of the second diaphragm than the first diaphragm 10 prevents the whole of the sample 6 from being viewed from the charged particle optical lens column, but moving the above-described XY driving feature of the sample stage enables every parts of the sample just below the second diaphragm 8 to be observed. Moving the sample stage on which the second diaphragm 50 is mounted allows the positional relationship between the first diaphragm 10 and the second diaphragm 50 to be changed in a state that they are in non-contact. Furthermore, as described below, a plurality of the second diaphragms 50 may be arranged in the vertical direction of (for example, directly beneath) the window of the first diaphragm 10 and to make the window area of the second diaphragms 50 smaller than the area of the first diaphragm 10, to simultaneously observe a plurality of samples. In this case, the primary charged particle beam that has been transmitted by or passed through the first diaphragm 10 will be simultaneously irradiated on some or whole of the plurality of the second diaphragms 50. Therefore, if the sample platform on which the second diaphragm and the samples to be observed are moved into the visual field of the window of the first diaphragm 10, the plurality of samples are able to be observed in the same field of view. Here, the term "window" refers to a region which the primary charged particle beam is transmitted by or passes through.

The charged particle beam that has been transmitted by or passed through the second diaphragm 50 is irradiated on the sample 6 and generates secondary charged particles such as secondary electrons or reflected electrons. These secondary charged particles can be detected by the detector 3 placed in the housing 7. Note that this detector is not necessarily placed in the housing 7, but may be placed in the atmospheric space in the vicinity of the first diaphragm 10, although not shown. Further, when the charged particle beam is irradiated on the sample 6, photons such as X-ray and cathode luminescence light are also released. Accordingly, a detector that can defect such photon rays may be provided in the atmospheric space in the housing 7 or near the first diaphragm 10. In addition, as described below, the detector of the secondary charged particles and photons may be placed directly beneath the sample 6. Moreover, the scattering probability of the charged particle beam is proportional to the mass number and density of the gas molecules. Accordingly, gas molecules with its mass number lighter than the atmosphere may be arranged between the first diaphragm 10 and the second diaphragm 50. For a type of such alternative gas, a gas lighter than the air such as nitrogen or water vapor is found to have an effect of improving the image S/N ratio, and further, a gas with much lighter mass such as helium and hydrogen gas provides larger effect of improvement in the image S/N ratio.

In the conventional art, a sample is in contact with a diaphragm located between a vacuum space and an atmospheric space, and thus the vacuum space needs to be returned to an atmospheric state in order to exchange the sample. On the other hand, according to the method of this embodiment, the liquid sample 6 is covered by the second diaphragm, which makes it easy to bring the sample 6 near the first diaphragm. Even if the sample 6 is brought near the first diaphragm 10 to the limit, the second diaphragm 50, which is placed between the sample 6 and the first diaphragm, prevents a direct contact of the sample 6 with the first diaphragm 10. Therefore, easy exchange of the sample can be carried, out at high throughput without removing the first diaphragm placed between the vacuum and atmospheric spaces.

<Transmission Detector>

Figure 4:
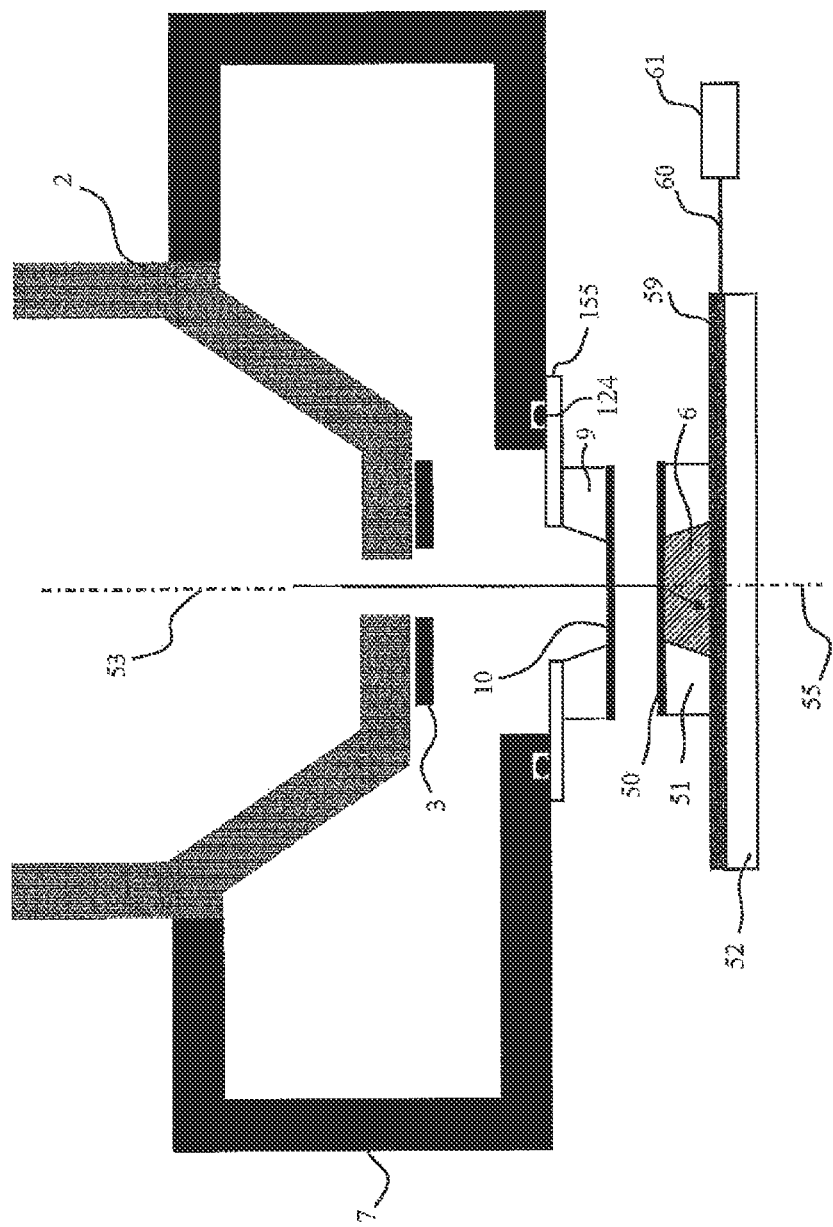
FIG. 4 is a detailed view of the vicinity of the diaphragm, the sample, and the detector.

Next, with reference to FIG. 4, description is made of a configuration for performing an observation of a transmission image of the sample 6. On the side of the sample 6 opposite to the second diaphragm 50, is provided a second detector 59 which is capable of detecting a charged particle beam that has been transmitted through the sample 6. The detector 59 is a detecting component, that can detect and amplify a charged particle beam that comes thereto flying with energy from several keV to tens keV. The detecting component includes, for example, a semiconductor detector made of semiconductor material such as silicon; and an element such as a scintillator, luminescent materials, and yttrium-aluminum-garnet (YAG) element which are capable of converting a charged particle signal to light on a glass surface or therein. A signal from the detector 59 is sent through a wire 60 to a preamplifier 61. The signal from the preamplifier 61 is sent through a wire (not shown) to the lower-level controller 37, and is used as a signal for forming an image. Although the preamplifier is arranged on the atmospheric space in FIG. 4, it may be arranged in the housing 7 or the sample stage 5. When the detector 59 is a detecting component converting a charged particle signal into light, the wire 60 is an optical transmission line and the pre-amplifier 61 is an optical-electrical signal amplifier capable of amplifying an optical signal to an electrical signal.

<Contact-Preventing Member>

Figure 5A:
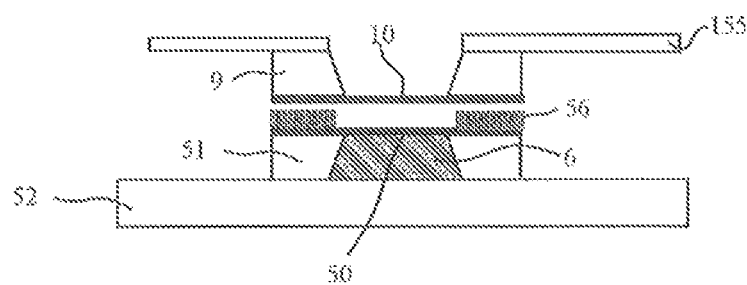
FIGS. 5A, 5B, and 5C each is a detailed view of an exemplary contact-prevention member.

Next, with reference to FIG. 5, description is made of a configuration including a contact-preventing member for preventing the diaphragm from being damaged due to a contact of the first diaphragm 10 with the second diaphragm 50 (or contact of the diaphragms with the stands). FIG. 5 illustrates only a vicinity of the diaphragms, and omits other elements such as the charged particle optical lens column 2 and the housing 7. FIG. 5A illustrates how the contact-preventing member 56 is provided in a vicinity of the second diaphragm 50. The contact-preventing member 56 may be located in the periphery of the diaphragms, or anywhere on the diaphragms. The above-mentioned arrangement of the contact-preventing member 56 may be able to prevent the diaphragms from contacting with each other even if the second diaphragm 50 is brought closer to the first diaphragm 10, and thus a user can operate the Z-axis driving feature of the sample stage 5 free from care. This contact-preventing member 56 can be manufactured by film forming or vapor deposition when the second diaphragm 50 is manufactured. Material for the contact-preventing member 56 is, for example, an organic film, a metal film, or the like. The thickness of the contact-preventing member 56 is approximately dozens of nanometers to 100 micrometers or less. This contact-preventing member 56 is provided on the second diaphragm 50 in FIG. 5A, but may be provided on the first diaphragm 10, and may be provided on both diaphragms. The contact-preventing member 56 is able to limit the minimum approaching-distance between the first diaphragm 10 and the second, diaphragm 50, and to prevent, the diaphragms from approaching each other at the limited distance or less.

For another material for the contact-preventing member, a foil material whose thickness is known may be later arranged on the first diaphragm 10 or the second diaphragm 50, which is a method of arranging a foil material, for example, an aluminum foil, in the vicinity of the first diaphragm 10 or the second diaphragm 50. This is an arrangement of enabling the foil material to be mounted after manufacturing the diaphragm 10 and the diaphragm 50, and thus enables easy changes of the thickness and the material itself of the contact-preventing member 56 after a first mounting of the contact-preventing member 56.

Figure 5B:
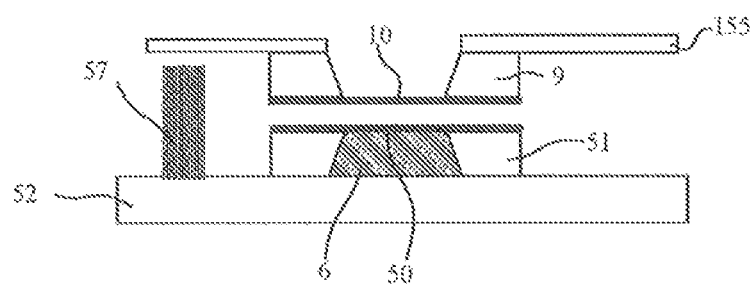

FIG. 5B shows a state in which the contact-preventing member 57 is mounted on the sample platform 52. When the second diaphragm 50 is brought close to the first diaphragm 10, the contact-preventing member 57 touches the diaphragm-holding member 155, which prevents the diaphragms from contacting with each other. The contact-preventing member 57 may be, for example, a bolt thread which is able to be fixed to the sample platform 52 by being screwed into a threaded hole provided on the sample platform 52. In FIG. 5B, the contact-preventing member 57 is mounted on the sample platform 52, but may be provided on the diaphragm-holding member 155 or on both of the sample platform 52 and the diaphragm-holding member 155.

Figure 5C:
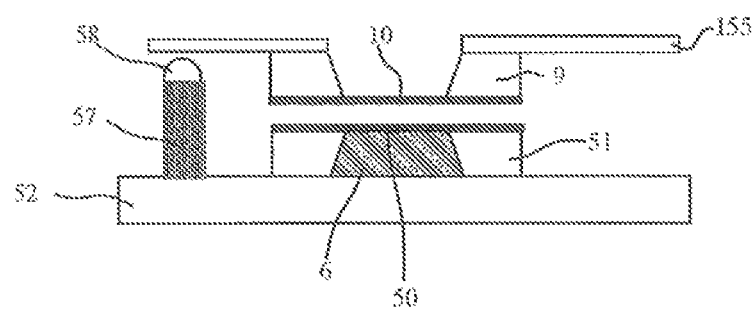

As shown, in FIG. 5C, the contact preventing member 57 may also have a rotating ball bearing 58 attached to a tip end thereof. In this case, this ball bearing 58 contacts with, the diaphragm-holding member 155. When the ball bearing 58 is attached to the tip end of the contact preventing members 57, the sample is able to be moved in the horizontal direction and in the direction perpendicular to the paper of FIG. 5C in a state of the contact preventing members 57 being in contact with the diaphragm-holding member 155. Here, a member attached to the tip end of the contact preventing member 57 is not limited to the ball bearing, as long as the configuration having the member enables the sample platform to be moved in the direction perpendicular to the optical, axis of the charged particle optical lens column in a state in which the distance is kept constant between the sample platform and the diaphragm-holding member 155 (or between the sample surface and the diaphragm) by the contact-preventing member 57. This member is referred to as a fine-adjustment member. If the friction between the contact-preventing member 57 and the diaphragm-holding member 155 is small, this fine-adjustment member may not need, to be a ball bearing. For example, decreasing the friction may be achieved by using a material with smaller friction coefficient among the organic materials such as fluorine-based resins typified by polytetrafluoroethylene, or by minimizing the contact area to improve sliding between the contact-preventing member 57 and the diaphragm-holding member 155.

<Arrangement of Multiple Second Diaphragm>

Figure 6:
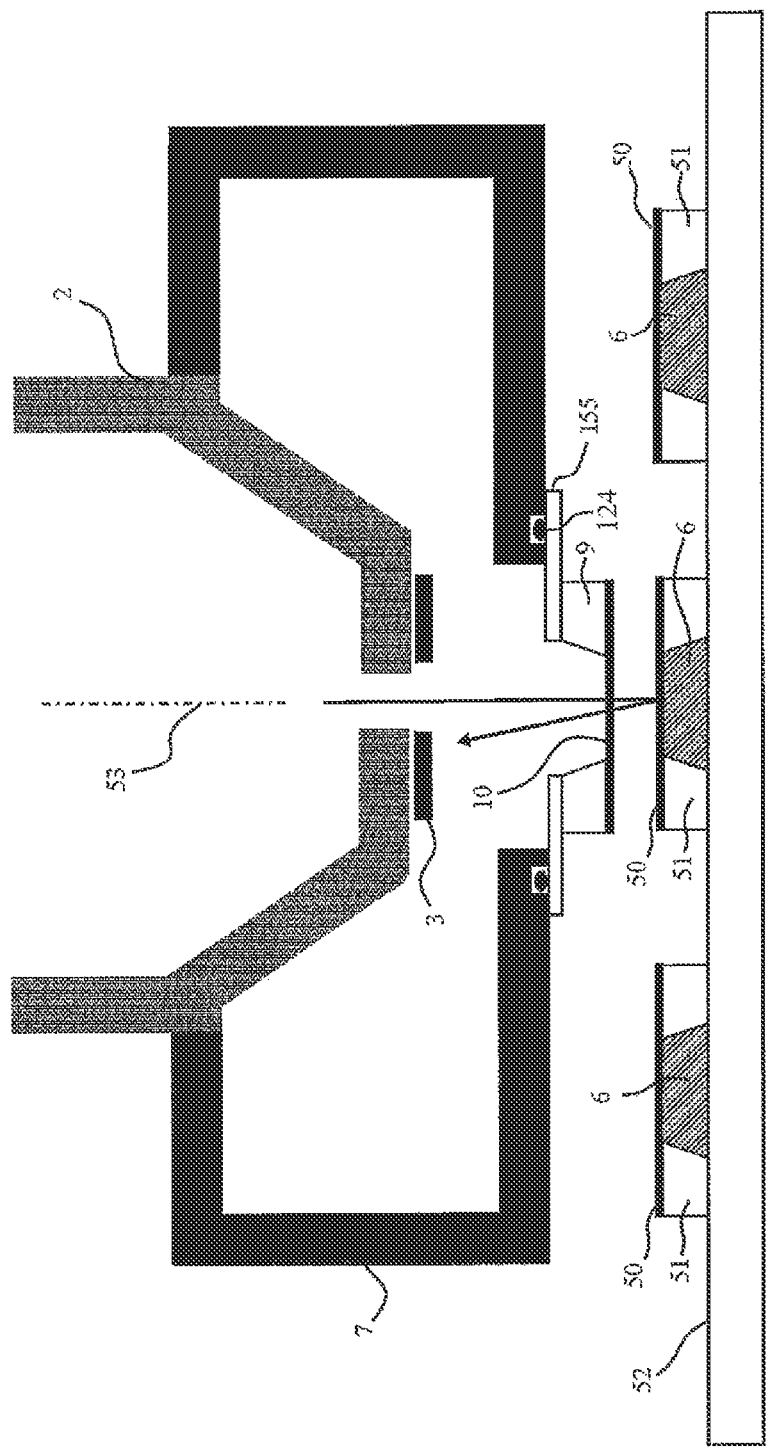
FIG. 6 is a detailed view of the vicinity of the diaphragm, the sample, and the detector.

While the above-described drawings shows only one second diaphragm 50 on the sample platform 52, more than one of the second diaphragms 50 may be disposed in the atmospheric space, as shown in FIG. 6. As in this case, if one plate member such as the sample platform or the sample stage is provided with plural sample mounting places and if various types of samples are able to be arranged beneath the diaphragm 50 by moving the plate member, very high throughput of observations and analyses of many samples using the charged particle beam can be performed. These observations and analyses may detect not only the secondary charged particles using the detector 3, but also the photon rays such as the above-mentioned X-ray and transmitted charged particle beams (not shown in the drawings), which may be performed using the plural detectors in separate times or concurrently. Further, if the sample stage 5 is provided with an automatic conveying facility, as a matter of course, much higher throughput is achieved. For example of the automatic conveying feature, the sample stage 5 is provided with the feature such as an electric motor to automatically convey the desired second diaphragm 50 blow the first diaphragm 10.

Figure 7A:
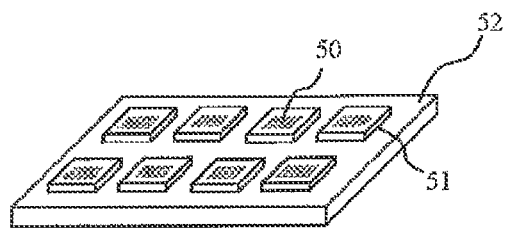
FIGS. 7A, 7B, and 7C each is a configuration example of the diaphragms, the samples, and a sample stage.
Figure 7B:
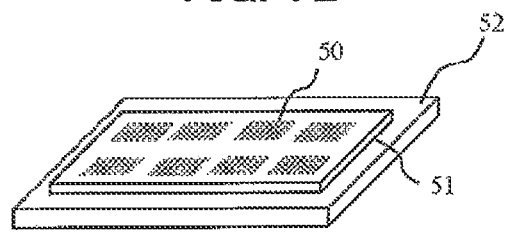
Figure 7C:
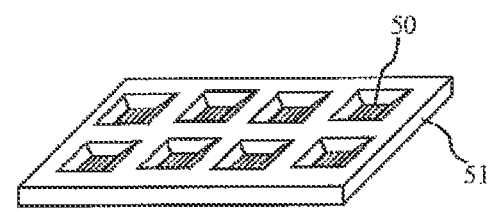

Furthermore, FIG. 6 describes the state in which the second diaphragms 50 are arranged only in the horizontal direction in the drawing, but a plurality of the second diaphragms 50 may be arranged two-dimensionally on a plane of the sample platform 52 as shown in FIG. 7A, or the single stand 51 may be shared only by the plural second diaphragms 50 and the plural samples. In the case shown in FIG. 7B, the view from the bottom surface of the stand 51 in FIG. 7B is FIG. 7C that shows a plurality of sample mounting places, which makes it very efficient to mount the sample 6. This case allows each of the samples to be placed on each of the diaphragms in the upside-down state of the stand 51 as shown in FIG. 7C, and the stand 51 to be turned over and to be mounted on the sample platform 52. Thereby, the samples are able to be sealed between the sample platform 52 and the second diaphragm 50. The liquid-leakage-preventing member such as rubber (not shown) may be arranged between the sample platform 52 and the stand 51. Additionally, the contact-preventing member 56 or 57 described above may be provided to prevent the contact of the first diaphragm 10 with the second diaphragm 50 and the damages thereof, although not shown. Further, FIG. 6 shows only one second diaphragm 50 disposed beneath the first diaphragm 10, but a plurality of the second diaphragms 50 whose window area each is much smaller than that of the first diaphragm 10 may be disposed beneath the first diaphragm 10. This case enables collective observations and analyses of plural samples beneath the plural second diaphragms 50.

<Liquid-Introducing Channel>

Figure 8:
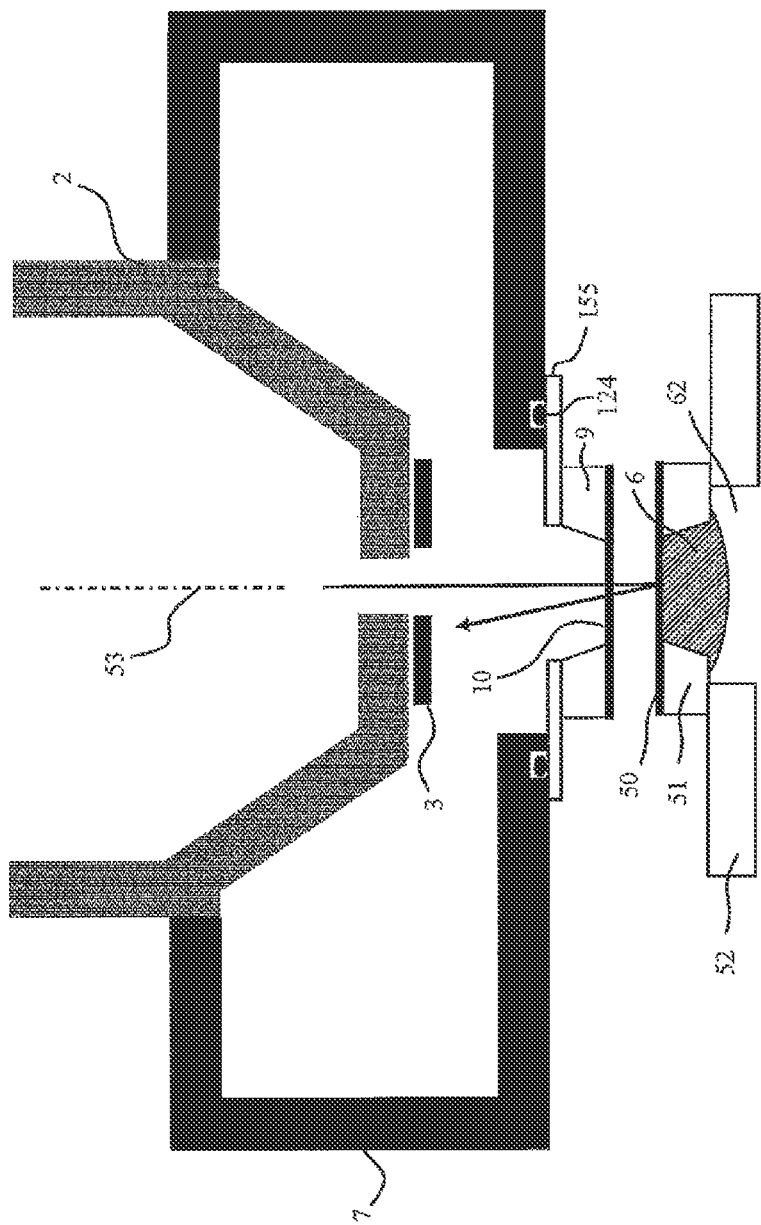
FIG. 8 is a detailed view of the vicinity of the diaphragm, the sample, and the detector.

Next, a description is made of a method of enabling the sample 6 to be mounted into a sample-holding space formed with the second diaphragm as a part thereof even in a state in which the distance between the first diaphragm 10 and the second diaphragm 50 is fixed. FIG. 8 shows an opening 62 through which the sample 6 can be introduced provided directly beneath the sample platform 52 (in a surface opposing to the second diaphragm). When the sample 6 is desired to be placed directly beneath the second diaphragm 50 in a state of the sample platform 52 being placed on the sample stage, the sample stage may be provided with an opening not shown in the drawings. This configuration makes it possible to mount the sample 6 in the state in which the distance between the first diaphragm 10 and the second diaphragm 50 is fixed and the charged particle beam is irradiated on the second diaphragm 50. This configuration is useful for the case in which the sample 6 is desired to be adjusted outside the device and to be immediately observed and analyzed by the secondary charged particle or the photon beam such as X-ray. Also, the sample may be introduced through the opening 62 outside the device in a state in which the sample platform 52 to which the stand 51 is closely contact or bonded is removed outside the device.

Figure 9:
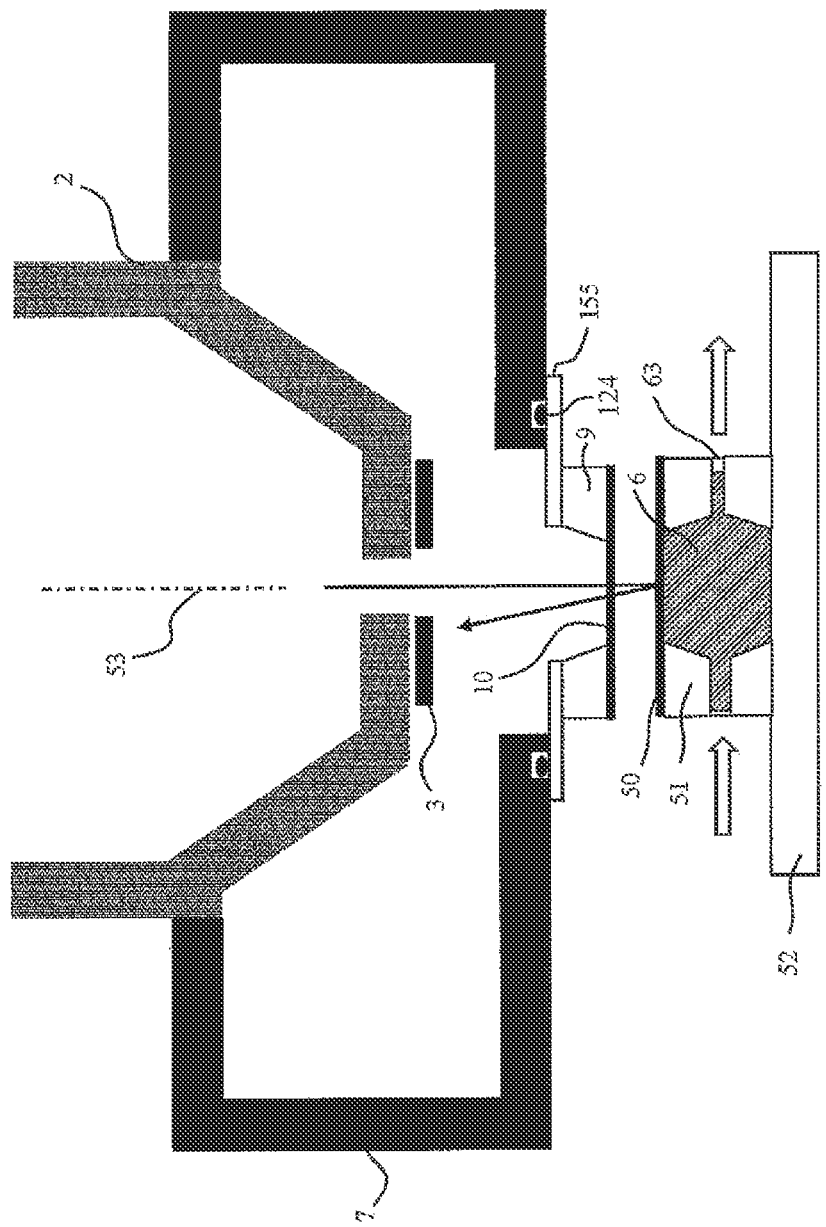
FIG. 9 is a detailed, view of the vicinity of the diaphragm, the sample, and the detector.

FIG. 9 shows a flow channel 63 in which the liquid flows being provided inside the stand 51 supporting the second diaphragm 50. In FIG. 9, the flow channel is formed by the stand 51, the sample platform 52, and the second diaphragm 50, but is not limited thereto and may be formed by a portion included by a member unified with the second diaphragm 50. Using the flow channel 63 makes it possible to flow the liquid sample, for example, in the direction of the arrow in FIG. 9. Moreover, as shown in FIG. 9, if is also possible to provide a liquid-discharging flow channel as well as the liquid-introducing opening. This configuration enables introducing the sample in the lateral direction of the stand 51, and thus makes it possible to introduce the sample more simply with higher throughput than the configuration of FIG. 8. Although not shown in FIG. 9, a sample-conveying channel such as a nozzle may be provided for introducing the sample into the flow channel 63.

Figure 10:
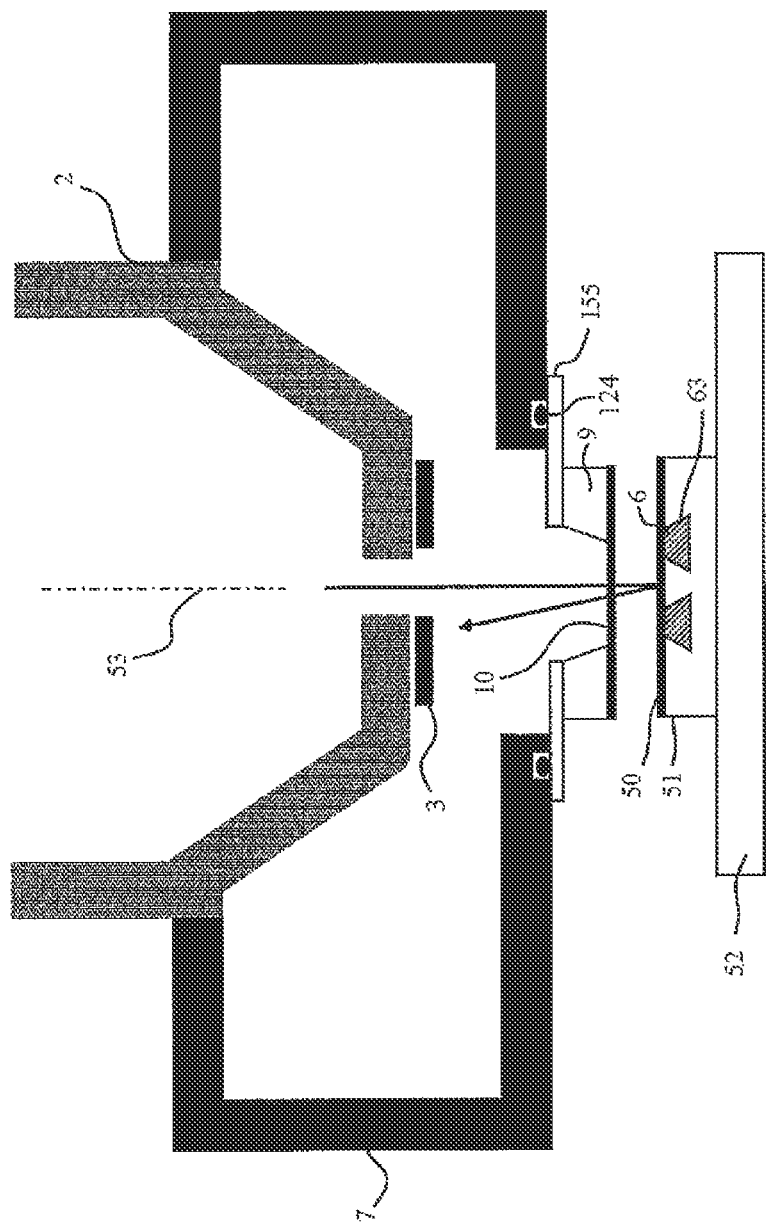
FIG. 10 is a detailed view of the vicinity of the diaphragm, the sample, and the detector.

FIG. 10 shows a configuration having a plurality of samples in contact with the flow channel 63 and the second diaphragm 50. In this case, the direction of introducing the samples is the direction perpendicular to the paper surface in FIG. 10. In such a configuration, a plurality of the second diaphragms 50 with a smaller window area than that of the first diaphragm 10 enable the collective observations and analyses of the samples flowing through a plurality of the flow channels 63.

<Optical Microscope>

Figure 11:
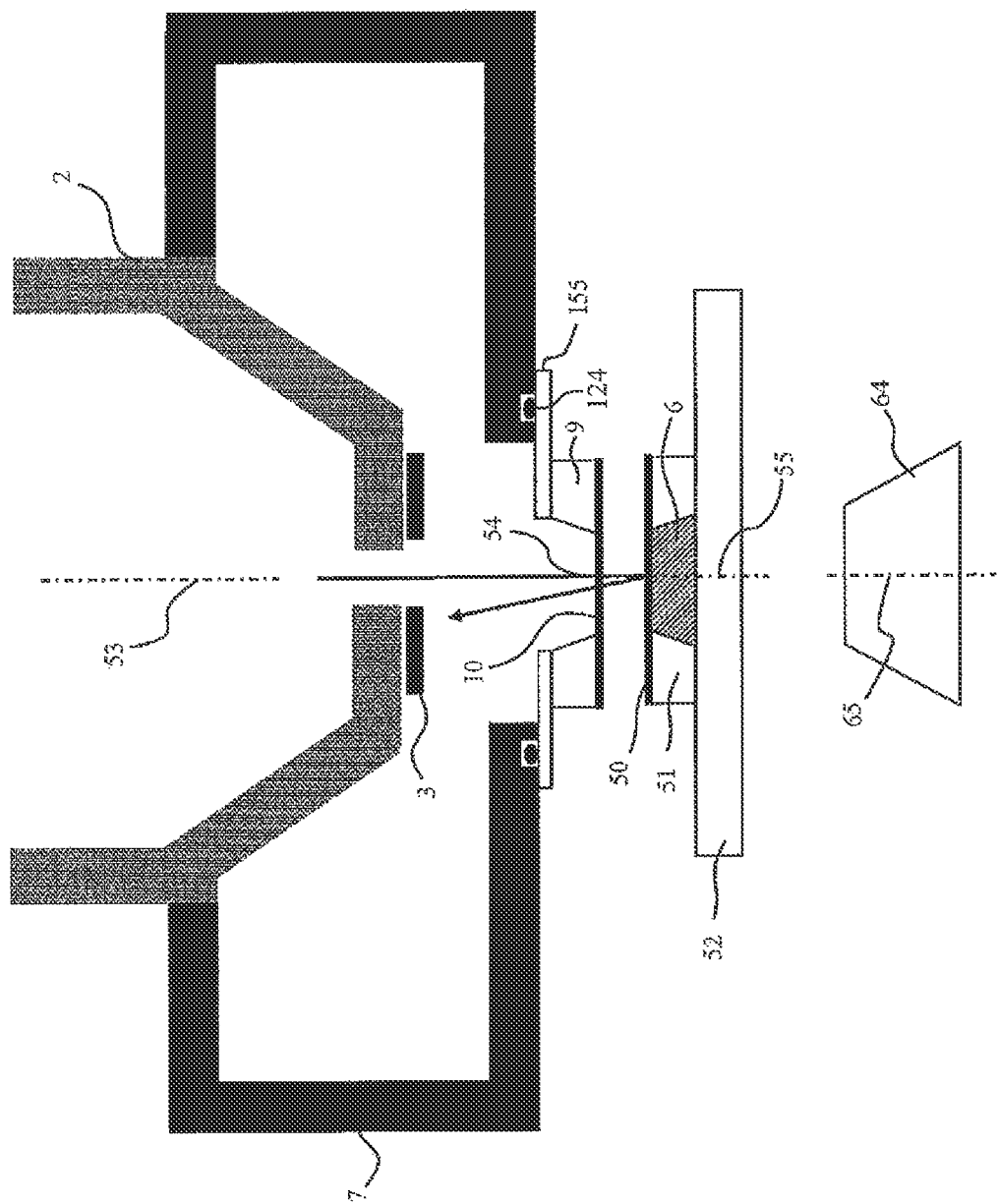
FIG. 11 is a detailed view of the vicinity of the diaphragm, the sample, and the detector.

Next, FIG. 11 shows a configuration having an optical microscope 64 beneath the sample platform 52. The optical microscope 64 is placed at the other side over the sample with respect to the second diaphragm 50. It is assumed that each position of the optical axis 53 of the charged particle optical lens column, the central axis 54 of the first diaphragm, the central axis 55 of the second diaphragm, and the optical axis 85 of the optical microscope 64 substantially coincides with each other. And, it is assumed that the sample stage 5 (not shown) is arranged in a configuration that interrupts no optical rays to the optical microscope 64. This configuration enables observations and analyses of the sample 6 with the optical microscope 84 as well as the charged particle beam microscope. However, in this case, the sample platform 52 needs to be transparent to optical rays to the optical microscope. The transparent material includes transparent glass, transparent plastic, transparent crystals, and the like. More common sample stage includes a transparent sample stage such as a slide glass (or preparation) and a dish (or Petri dish). Note that the above description uses the term "microscope" for convenience, but that it is possible to observe with the optical microscope a behavior of the sample on which the charged particle beam is irradiated, or to observe with the charged particle beam microscope a behavior of the sample on which a light from the optical microscope is irradiated.

<Other Configurations>

In addition, in the vicinity of the second diaphragm may be arranged a device such as a heater or a voltage applying unit which is capable of generating an electrical field into the sample. This arrangement, enables observations of a state change of the sample being gradually heated or cooled, or a state change of the sample being applied with an electric field. Although the above description relates to the arrangement of the two types of diaphragms including the first diaphragm and the second diaphragm, the number of diaphragms may be three or more. For example, the charged particle optical lens column 2 may be provided with a diaphragm therein. The present invention defines no limit of the number of the diaphragms. And, an SEM or a charged particle beam device that satisfies the features intended by this embodiment belongs to the category defined by this embodiment.

Embodiment 2

Figure 12:
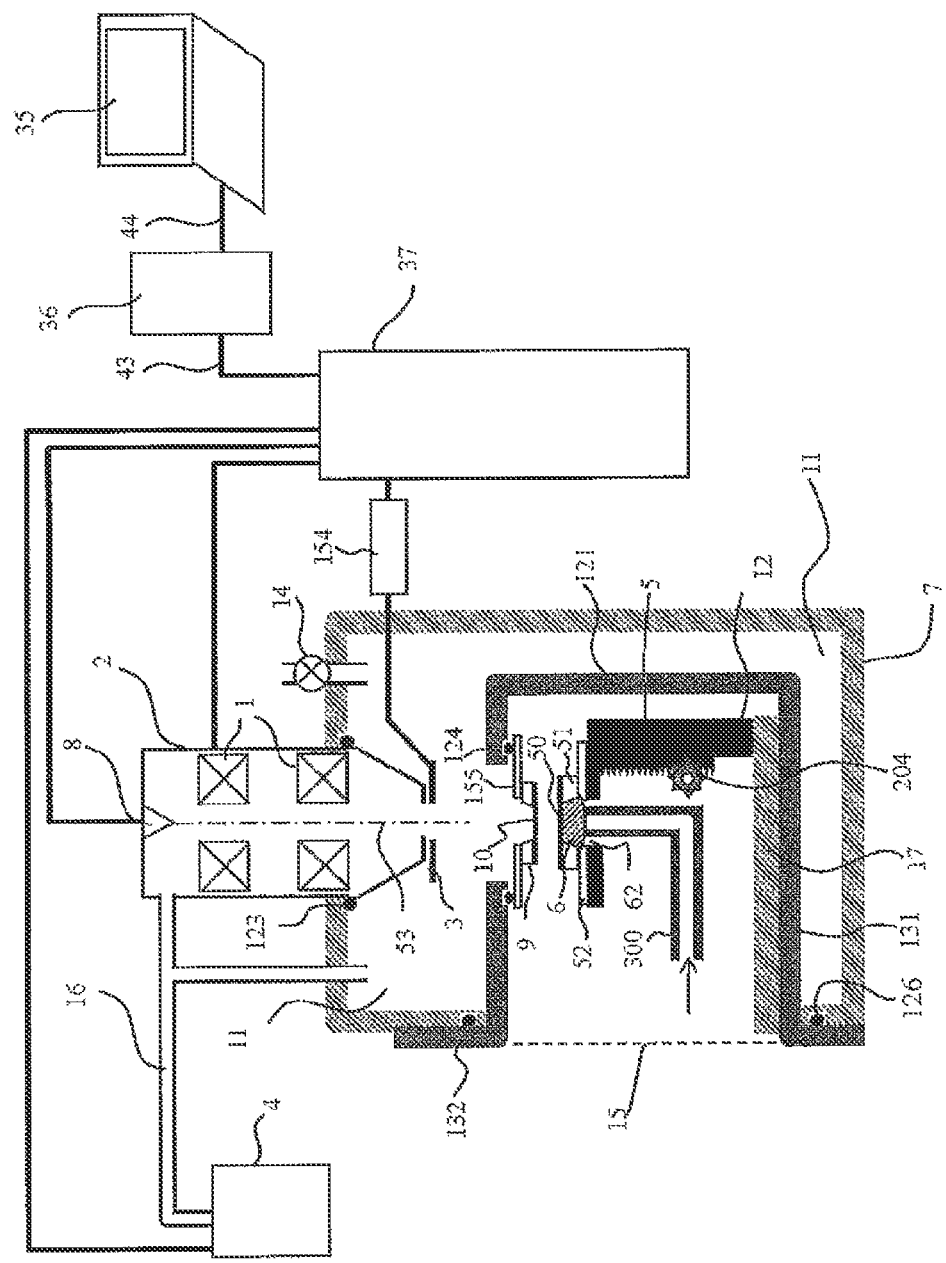
FIG. 12 is a view of a general configuration of a charged particle microscope according to Embodiment 2.

Next, the below description explains a configuration of device that enables a easy observation of a sample at one air pressure using a typical charged particle beam device. FIG. 12 shows a general configuration of a charged particle microscope according to Embodiment 2. Similarly to Example 1, the charged particle microscope of the present embodiment also includes the charged particle optical lens column 2, the housing (vacuum chamber) 7 that supports the charged particle optical lens column immovably with respect to a device-installation surface, the sample stage 5, and the like. The operation and function of each of these components, or additional elements added to each, component are substantially the same as those in Example 1, and therefore detailed description thereof is omitted.

This configuration comprises a second housing (attachment) 121 that is inserted into the housing 7 (hereinafter, a first housing) to be used. The second housing 121 includes a body portion 131 with a rectangular shape and a fitting portion 132. At least one of the sides with the rectangular shape of the body portion 131 is an open surface 15, as described later. Among the sides with the rectangular shape of the body portion 131, sides other than a side at which the diaphragm holding member 155 is placed, may be formed by side walls of the second housing 121, or by side walls of the first housing 7 in a state that the second housing 121 itself has no walls for these sides and the second housing 121 is incorporated in the housing 7. The second housing 121 is placed fixedly at the side surface or the inner wall surface of the first housing 7 or the charged particle optical lens column. The body portion 131 has a feature of storing the sample 6 to be observed, and is inserted into the first housing 7 through an opening of the first housing 7. The fitting portion 132 includes a fitting surface mated with the outer wall surface of the side provided with the opening of the first housing 7 and fixed to the outer wall surface of the above-mentioned side surface through a vacuum-sealing member 126. This makes the whole of the second housing 121 engaged with the first housing 7. The most convenient way to produce the above-described opening is a way of utilizing an opening for mounting and dismounting the sample, which opening is originally provided in the vacuum sample chamber of the charged particle microscope. That is, if the second housing 121 is produced in a size matching a size of the original opening that is originally formed and the vacuum-sealing members 126 are attached onto the periphery of the opening, the modification of the device requires only the minimum necessary. Additionally, the second housing 121 is removable from the first housing 7.

The side surface of the second housing 121 is the open surface 15 which is communicated with the atmospheric space via a surface with a size that enables at least mounting and dismounting of the sample, and the sample 6 stored inside the second housing 121 (right from the dotted line in FIG. 12; hereinafter, a second space) is placed in the atmosphere of the one air pressure during an observation. In addition, because FIG. 12 is a cross-sectional view of the device in the direction parallel to the optical axis, it shows only one side as the open surface 15. However, if the space 11 is vacuum-sealed by the side surfaces of the first housing in the depth direction and the front direction of the paper, the number of the open surfaces 15 of the second housing 121 is not limited to one. At least one open, surface is needed in the state in which the second housing 121 is incorporated in the first housing 7. At the same time, the first housing 7 is connected with a vacuum pump 4, which enables vacuum-evacuation of a closed space formed by the inner wall surface of the first housing 7, the outer wall surface of the second housing, and the diaphragm 10 (hereinafter, the first space). Arrangement of the diaphragms such as keeping the pressure in the second space larger than that of the first space enables the second space to be isolated in terms of the pressure, in this embodiment. That is, the first space 11 is kept highly vacuum by the diaphragm 10, while the second space 12 is kept in a gas atmosphere of one air pressure or almost the same pressure as one air pressure, and therefore, the charged particle optical lens column 2 and the detector 3 are able to be kept in a vacuum, state and the sample 6 is able to be kept at one air pressure during an operation of the device. Additionally, the second housing 121 has the open surface, which enables the sample 6 to be exchanged during the observation without any restriction.

The upper surface of the second housing 121 is provided with the first diaphragm 10 at a position which is directly beneath the charged particle optical lens column 2 when the second housing 121 is entirely fitted info the first housing 7, The first diaphragm 10 can transmit or be passed through by the primary charged particle beam emitted from the lower end of the charged particle optical lens column 2. The primary charged particle beam finally reaches the sample 6 after being transmitted or passing through the first diaphragm 10.

As described above, the installation of the attachment provided with the diaphragm enables the sample observation at one air pressure or in a gas atmosphere using a typical vacuum-operating charged particle beam device. Furthermore, the above-mentioned liquid-introducing feature enables an observation of the sample which is placed, at one air pressure or in a gas atmosphere and is in liquid-infiltrated state. Additionally, the attachment of the present embodiment is easy to increase in size, because the attachment is of the type that is inserted through the side surface of the sample chamber.

The second, housing 121 is provided, with the sample stage 5 therein. On the sample stage 5 is arranged the sample platform 52, on which is arranged the sample stand 51 equipped with the second diaphragm 50. With reference to FIG. 12, description is made of a configuration of a device which is provided with a liquid-introducing/discharging unit 300 that is able to introduce the sample 6 containing liquid in a state that the first diaphragm 10 is close to the second diaphragm 50. This configuration is provided, with the liquid-introducing/discharging unit 300 and the opening 62 below the sample placed on the sample stage 5 inside the second housing 121. The liquid introduced through the liquid-introducing/discharging unit 300 is sent to the sample 6 through the opening 62. The liquid-introducing/discharging unit 300 may be affixed to the sample stage 5 or the second housing 121 using material such as metal, adhesive, tape, or the like. Also, the sample platform 52 may be fixed on the sample stage 5 using some member. The sample 6 or the sample platform 52 can be easily transported through the open surface 15 to the inside of the second housing 121.

The liquid-introducing/discharging unit 300 is, for example, tubing such as a nozzle or a straw that is able to carry liquid, and may be fixed or detachably attached to the sample stage 5. Additionally, the function of the liquid-introducing/discharging unit 300 may be implemented by a spoon-like tool capable of holding a few drops of liquid. For example, the sample is supplied with the liquid by steps of: first placing the liquid on a spoon outside the device; next bringing the spoon holding the liquid near the sample; and then making the liquid contact to the sample from the beneath of the sample. The following way is also available: first making the liquid contact to the lower side of the sample opposite to the side to be irradiated by the charged particle beam at the outside of the device; next placing the sample on the sample stage 5; then placing the sample beneath, the diaphragm; and then, irradiating the charged particle beam onto the sample. As long as the liquid is introduced to the sample from the lower side (for example, from the bottom, surface or the lateral surface of the sample) than the sample surface on which the charged particle beam is irradiated, the liquid may be introduced in any manner.

Note that the configuration of FIG. 12 is an explanatory diagram of the configuration of the device configured on the basis of the configuration of FIG. 8, but that the liquid-introducing/discharging unit 300 and the opening 82 are dispensable and that as described above, the sample may be mounted by the following steps: first mounting the sample on the sample platform, providing the second diaphragm 50 on the sample, and then carrying the sample platform into the interior of the second housing 121.

The above description is made with respect to the arrangement of the second diaphragm 50 inside the second housing 121 in the second embodiment. Note that the second diaphragm 50, its stand, and the liquid-introducing/discharging unit 300 may be located in the other places and arranged in another way other than the above description, and an SEM or a charged particle beam device that meets the functions intended by this embodiment belongs to the category of the SEM or the charged particle beam device according to this embodiment.

Embodiment 3

Figure 13:
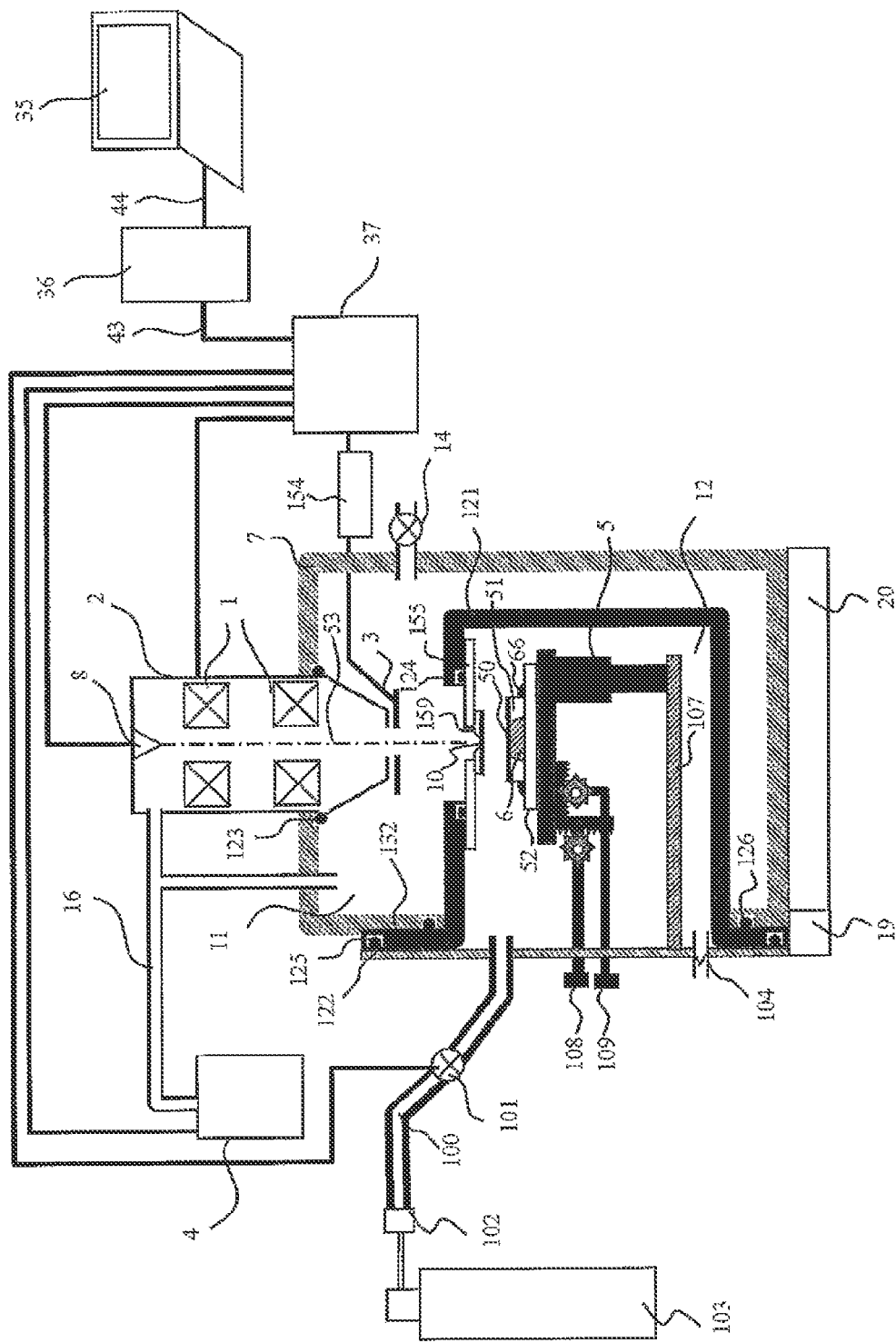
FIG. 13 is a view of a general configuration of a charged particle microscope according to Embodiment 3.

FIG. 13 shows a view of a general configuration of a charged particle microscope according to Embodiment 3. Similarly to Examples 1 and 2, the charged particle microscope of the present embodiment also includes the charged particle optical lens column 2, the first housing (vacuum chamber) 7 that supports the charged particle optical lens column 2 immovably with respect to a device-installation surface, the second housing (attachment) 121 that is inserted into the first housing 7 to be used, and the control system, and the like. The operation and function of each of these components, or additional elements added to each component are substantially the same as those of Examples 1 and 2, and therefore detailed description thereof is omitted.

The charged particle microscope according to the present embodiment is intended to have the open surface forming at least one side surface of the second housing 121 covered with a cover member 122, which allows implementation of various functions, as described below.

<Sample Stage>

The charged particle microscope according to the present embodiment is provided with a sample stage 5 as a means for moving an observation visual field by changing the sample position on the cover member 122. The sample stage 5 has an XY-axis driving feature in the direction flush with the sheet of this drawing and a Z-axis driving feature in the direction of the device height. The cover member 122 has a support plate 107 attached thereto as a bottom plate for supporting the sample stage 5 which is fixed to the support plate 107. The support plate 107 is attached in a manner of extending through the inside of the second housing 121 toward the surface of the second, housing 121 opposing to the cover member 122. From the Z-axis driving feature and the XY-axis driving feature, branch shafts extend and connect to handling knobs 108 and 109 respectively, which are equipped at the cover member 122. A device user operates these handling knobs 108 and 109 to adjust the position of the sample 6 in the second housing 121.

<Atmosphere Surrounding Samples>

The charged particle microscope according to the present embodiment has a function of supplying an alternative gas into the second enclosure or a function capable of generating a pressure state different from that of an outside air in the first space 11 and outside the device. A charged particle beam emitted from the lower end of the charged particle optical lens column 2 passes through the first space kept in a high vacuum state, then the first diaphragm 10, and enters the second space kept in a state of one air pressure or a lower vacuum state (than that the first space), and then passes through the second diaphragm 50 and is irradiated onto the sample 6. Because an electron beam is scattered by gas molecules in the atmospheric space, the mean free path becomes shorter. That is, if the distance between the diaphragm 10 and the sample 6 is large, the secondary electrons, the reflected, electrons, the transmitted electrons, or the like generated by irradiation of the primary charged particle beam or the charged particle beam cannot reach the sample and the detector 3. In another aspect, the scattering probability of the charged particle beam is proportional to a mass number and a density of gas molecules. Thus, if the second space has its atmosphere replaced with gas molecules lighter in mass number than the air or is slightly evacuated, the scattering probability of the electron beams decreases and the charged particle beam becomes able to reach the sample. Alternatively, it is sufficient if at least a path of the charged particle beam in the second space, that is, the atmospheric space between the first diaphragm 10 and the second diaphragm 50 in place of the entire second space is able to have its atmosphere replaced by gas or to be evacuated.

For the above reasons, the charged particle microscope of the present embodiment is provided with an attaching portion for a gas supply pipe 100 (gas inlet) at the cover member 122. The gas supply pipe 100 is connected, to a gas cylinder 103 via a coupler 102, which introduces the alternative gas into the second space 12. In the middle of the gas supply pipe 100, is disposed a gas control valve 101, which enables controlling of the flow rate of the alternative gas flowing in the pipe. Accordingly, a signal line extends from the gas control valve 101 to the lower-level controller 37 so that a device user can control the flow rate of the alternative gas while viewing an operation screen displayed on a monitor of a computer 35. In addition, the gas control valve 101 may be opened and closed by manual operation.

For a type of the alternative gas, a gas lighter than, the air such as nitrogen or water vapor is found to provide an effect of improving an image S/N ratio, and a gas with much lighter mass such as helium and hydrogen gas provides larger effect of improvement in the image S/N ratio.

The alternative gas is a light element gas, and therefore, fends to easily accumulate in the upper part of the second space 12 and the bottom part is hard to replace. Accordingly, the cover member 122 is provided with an opening for communicating the inside and outside of the second, space below the attaching portion of the gas supply pipe 100. For example, FIG. 13 shows an opening provided at an attaching position of the pressure-regulating valve 104. This allows the atmospheric gas to be pushed by the light element gas introduced via the gas inlet and to be discharged via the opening at the bottom side, and thus enables an effective replacement of gas in the second housing 121. In addition, this opening may also be used together as a rough exhaust port described below.

The pressure-regulating valve 104 may be provided instead of the above opening. This pressure-regulating valve 104 has a function of automatically opening when the internal pressure of the second housing 121 becomes equal to or higher than one air pressure. Providing the pressure-regulating valve having such a function enables automatic opening to discharge the atmospheric gas components such as nitrogen and oxygen outside the device and to fulfill the inside of the device with the light element gas when the internal pressure of the second housing 121 becomes equal to or higher than one air pressure in the introduction of the light elements gas. It should be noted that the gas cylinder or the vacuum pump 103 shown in FIG. 13 may be provided in the charged particle microscope or may be attached by the device user after the device has been installed.

Additionally, even light element gas such as helium or hydrogen sometimes largely scatters the electron beam. In this case, the large scattering may be solved by replacing the gas cylinder 103 to a vacuum pump. This enables the inside of the second housing to be in an extremely low vacuum state (i.e., an atmosphere with a pressure close to one air pressure) by slightly evacuating. In other words, this enables the space between the first diaphragm 10 and the second diaphragm 50 to be in a vacuum state. For example, the second housing 121 or the cover member 122 is provided with an evacuation port to slightly evacuate the inside of the second housing 121. Thereafter, the alternative gas may be introduced. The evacuation in this case is needed only to reduce the atmospheric gas components remaining within the second housing 121 to a predetermined amount or less, and thus a high-vacuum evacuation is not needed and thus only rough evacuation is necessary. The evacuation of the second space requires providing a vacuum-sealing member 66 between the stand 51 and the sample platform 52. This vacuum-sealing member may be bonded to the stand 51 and the sample platform 52 with an adhesive and the like, or the pressure states of the inside of the second diaphragm may be separated from that of the second housing 121 by using an O-ring or a gasket not shown in FIG. 13. Also, although not shown, it may be available to form a configuration such as pressing a contact between the stand 51 and the sample platform 52 using a metal material, a screw, or the like to stably keep an airtight state.

The above-mentioned arrangement of the two diaphragms of the first diaphragm 10 and the second diaphragm 50 enables the sample observation and replacement to be much shorter in the time from mounting to observation of the sample 6 and significantly higher in throughput than the conventional art.

As described above, this embodiment is able to regulate the atmospheric pressure of the space in which the sample is placed to any vacuum degree from one air-pressure (approximately $10^5$ Pa) to approximately $10^3$ Pa. The conventional so-called low vacuum scanning electron microscope has a difficulty in regulating the atmosphere pressure of the sample chamber between one air pressure (approximately $10^5$ Pa) and approximately $10^3$ Pa, because the communication between the electron beam column and the sample chamber causes a change of the pressure in the electron beam, column in conjunction with lowering of the vacuum degree in the sample chamber to a pressure close to one air pressure. According to this embodiment, since the second space is separated from the first space by a thin film, the pressure and the gas type of the atmosphere in the second space 12 surrounded by the second housing 121 and the cover member 122 can be freely regulated. Accordingly, this embodiment enables regulating the atmospheric pressure in the sample chamber in the range from one air pressure (approximately $10^5$ Pa) to approximately $10^3$ Pa, which has been difficult to stably keep by the conventional art. In addition, this embodiment enables the observation of the sample state while continuously changing the atmospheric pressure around one air pressure.

Although not shown, the gas cylinder 103 may be a unit such as a composite gas controller which connects a gas cylinder with a vacuum pump in a complex manner. Although not shown, a heating feature may be arranged inside the second, housing 121 for heating the sample 6 beneath the second diaphragm 50.

<Liquid- or Gas-Introducing/Discharging Unit>

Figure 14:
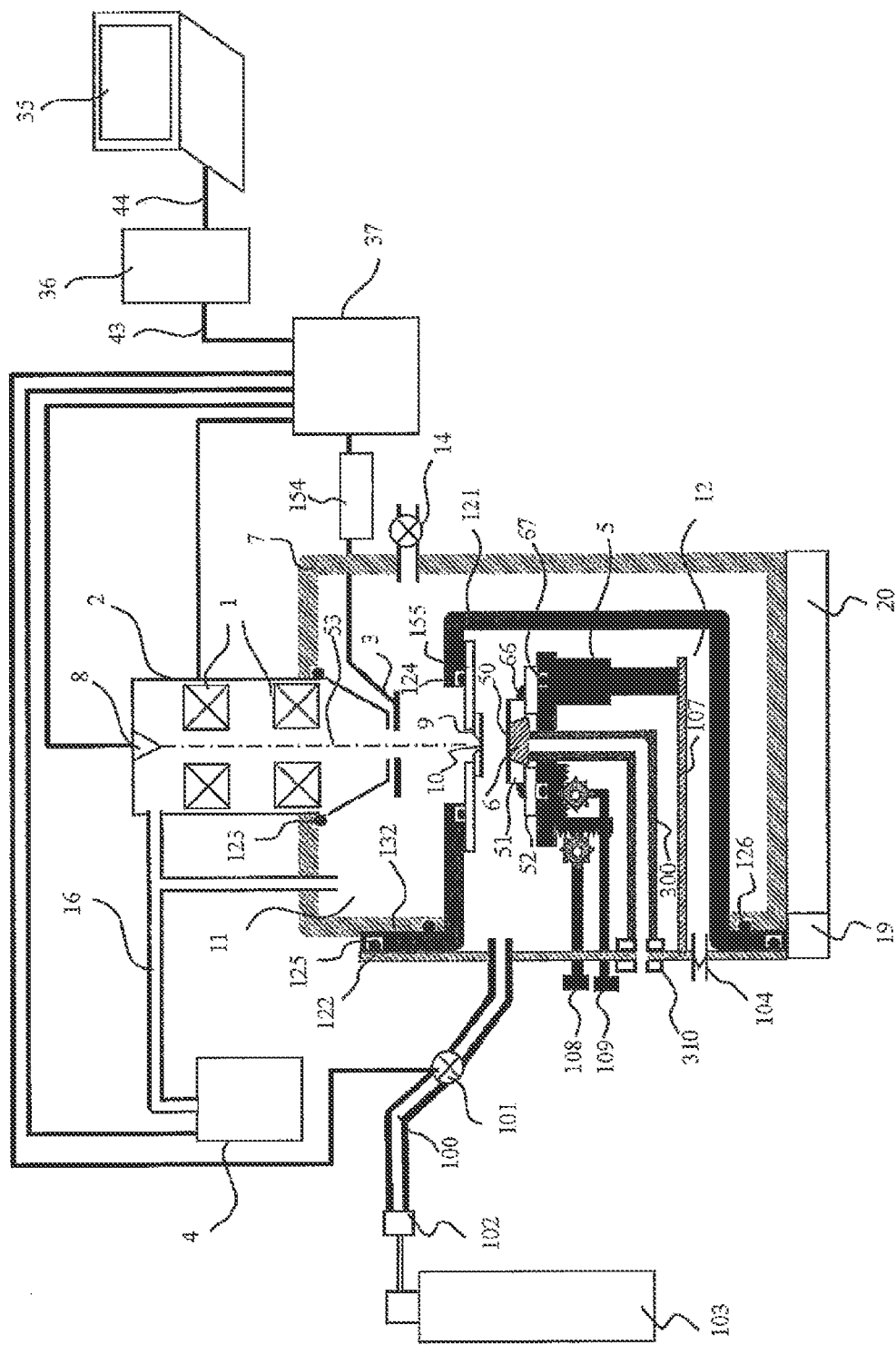
FIG. 14 is a view of a general configuration of a charged particle microscope according to Embodiment 3.

Next, FIG. 14 shows a configuration for setting the sample in a state of being covered by the second diaphragm 50 to be separated from the air space outside the device. As in the previous embodiment, this configuration includes a liquid-introducing/discharging unit 300 in the vicinity of the sample stage 5 and the sample 6. The liquid-introducing/discharging unit 300 is connected to the cover member 122. Providing the connecting part 310 at the cover member 122 further facilitates attaching of a liquid-introducing/discharging controller such as a pump or a syringe for introducing and discharging liquid from the outside of the device. As described above, the inner space of the second housing may be in an intended state of a gas or a low vacuum state. Accordingly, the vacuum-sealing member 68 is provided not only between the stand 51 and the sample platform 52 which support the second diaphragm 50, but also between the sample platform 52 and the sample stage 5. Although not shown, a configuration may be used, such that a metal member or a screw presses a contact between the stand 51 and the sample platform 52 and a contact between the sample platform 52 and the sample stage 5, to stably keep the airtight state.

The configuration of this embodiment has a feature that the second space 12 inside the second housing is closed, as compared to the configuration described above. Accordingly, this can provide a charged particle beam device which is able to, for example, introduce the gas into or evacuate from the space between the first diaphragm 10 and the second diaphragm 50.

<Others>

As described above, in this embodiment, all of the sample stage 5, the handling knobs 108 and 109 thereof, the gas supply pipe 100, the pressure-regulating valve 104, and the connecting part 310 are aggregated into the cover member 122 to be installed. Thus, a device user can operate the handling knobs 108 and 109, replacement work of the samples, or control of the gas supply pipe 100 and the pressure-regulating valve 104, and regulation of liquid introducing/discharging while facing at the same surface of the first housing. Thus, the operability is greatly improved compared to the charged particle microscope configured to be attached with the above components separately disposed on the different sides of the sample chamber.

In addition to the configuration described above, the contact monitor for monitoring a contact state of the second housing 121 with the cover member 122 may be provided to check if the second space is closed or open.

Further, in addition to the secondary-electron detector and the reflected-electron detector, an X-ray detector and a light beam detector may be provided to enable EDS analysis and detection of fluorescence ray. The X-ray detector and the light detector may be located in either of the first space 11 and the second space 12.

As described above, in addition to the effects of Example 1 and 2, the present embodiment enables introducing of an alternative gas with a pressure different from one air pressure, and further, enables the sample observation in an atmosphere different in pressure from the first space. Furthermore, removing the diaphragms to communicate the first space and the second space achieves an SEM which allows an observation of a sample under the same vacuum state as the first space, in addition to the observation at one air pressure and a specified gas atmosphere.

Embodiment 4

Figure 15A:
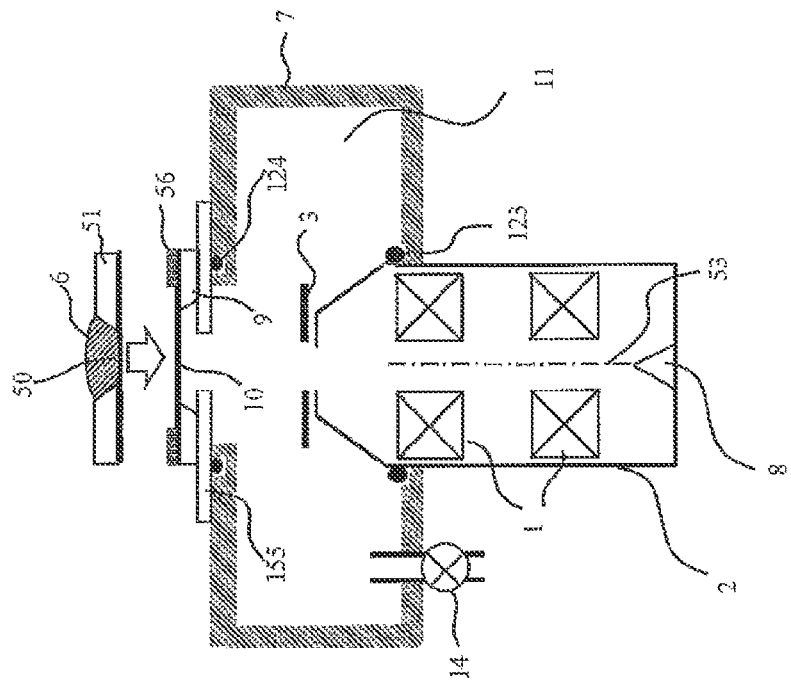
FIGS. 15A and 15B are views of a general configuration of a charged particle microscope according to Embodiment 4.

This embodiment describes a configuration that is a modification of the first embodiment and has the charged particle optical lens column 2 beneath the first diaphragm 10. FIG. 15A shows a configuration diagram of a charged particle microscope according to the present embodiment. The vacuum pump and the control system, and the like are omitted. And, the housing 7 that is a vacuum chamber and the charged particle optical lens column 2 are assumed to be supported by pillars or supports, and the like to be immovable with respect to the device installation surface. The operation and function of each of these components, or additional elements added to each component are substantially the same as those in the above-mentioned examples, and therefore detailed description thereof is omitted.

This device is provided with a sample stage 5 that closes the second diaphragm 50 on which the sample 6 is mounted on the first diaphragm 10. This device configuration allows an observation of the sample surface of the lower side of the sample 6 in FIG. 15A, that is, the contact surface of the second diaphragm 50 with the sample 6. In this configuration, the upper side of the device is open, and the surface of the second diaphragm is directed to the bottom of the device, this enables mounting the sample 6 on the second diaphragm by utilizing the gravity of the sample.

Figure 15B:
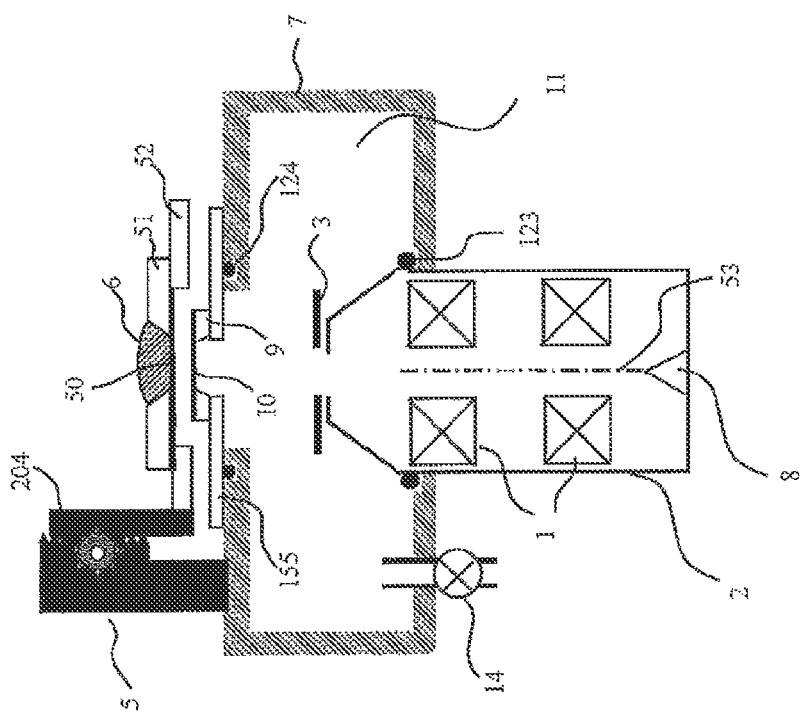

As shown in FIG. 15B, the stand 51 provided with the second diaphragm 50 may be mounted directly onto the first diaphragm 10 (in the direction of the arrow in FIG. 15B). This configuration does not necessarily require the sample stage 5, and enables a secure arrangement of the stand 51 provided with the second diaphragm 50 by placing a thickness-defined contact-preventing member 56 such as a thin film or a removable foil material between the first diaphragm 10 and the second diaphragm 50. Changing a positional relationship between the first diaphragm 10 and the second diaphragm 50 is achieved by moving the stand 51 in the horizontal direction and the direction perpendicular to the sheet surface in the drawing. The stand 51 may be moved by hand or a jig, or by moving a sample stage having a moving means only in the XY direction.

REFERENCE SIGNS LIST

1: optical lens,
2: charged article optical lens column,
3: detector,
4: vacuum pump,
5: sample stage,
6: sample,
7: housing,
8: charged particle source,
9: stand,
10: first diaphragm,
11: first space,
12: second space,
13: tip portion of droplet sample,
14: leak valve,
15: open surface
16: vacuum pipe
17: stage support stand,
18: struts,
19: support member for cover member,
20: bottom plate,
35: computer,
36: higher-level controller,
37: lower-level controller,
43, 44, 45: communication line,
50: second diaphragm,
51: stand,
52: sample platform
53: optical axis of charged particle beam,
54: center axis of first diaphragm,
55: center axis of second diaphragm,
56: contact-preventing member,
57: contact-preventing member,
58: ball bearing,
59: detector,
60: wire or optical transmission path,
61: pre-amplifier or optical-electrical signal amplifier,
62: opening,
63: flow channel,
64: optical microscope,
65: optical axis of optical microscope.
66: vacuum-sealing member,
100: gas supply pipe,
101: gas control valve,
102: coupler,
103: gas cylinder or vacuum pump,
104: pressure-regulating valve,
107: support plate,
108, 109: handling knob,
121: second housing,
122, 130: cover member,
123,124,125,126,128,129: vacuum-sealing member,
131: body portion,
132: fitting portion,
154: signal amplifier,
155: diaphragm-holding member,
204: sample position controlling knob,
300: liquid-introducing/discharging unit

The invention claimed is:

1. A charged particle beam device comprising:
a charged particle optical lens column irradiating a primary charged particle beam on a sample;
a housing connected with the charged particle optical lens column at an upper side of the housing, and having an internal space evacuated by a vacuum pump;
a first diaphragm being provided on a bottom surface of the housing and separating a vacuum in an internal space of the housing and a gas atmosphere in an external space to the housing to keep an airtight state of the evacuated internal space, and allowing the primary charged particle beam to be transmitted by or pass through the first diaphragm;
a second diaphragm being arranged between the first diaphragm and the sample, and allowing the primary charged particle beam to be transmitted thereby or pass therethrough, wherein
the first diaphragm and the second diaphragm are separated with each other across the external space to the housing, and
the primary charged particle beam is irradiated on the sample which is in contact with the second diaphragm.

2. The charged particle beam device according to claim 1, comprising a sample stage capable of being mounted with the second diaphragm and the sample, wherein
a positional relationship between the first diaphragm and the second diaphragm is able to be changed in a state in which the first diaphragm and the second diaphragm are not in contact with each other.

3. The charged particle beam device according to claim 1, wherein
the sample is introduced into a sample-holding space whose part is formed with the second diaphragm, in a state in which a distance between the first diaphragm and the second diaphragm is fixed.

4. The charged particle beam device according to claim 1, wherein
a plurality of the second diaphragms are arranged on a sample platform or a sample stage.

5. The charged particle beam device according to claim 4, wherein
a window area of the second diaphragm is smaller than that of the first diaphragm.

6. The charged particle beam device according to claim 1, comprising
an optical microscope that is arranged at the other side over the sample with respect to the second diaphragm.

7. A sample stage unit used for a sample observation device, the sample observation device including a first diaphragm provided under the charged particle optical lens column to allow a primary charged particle beam to be transmitted thereby or pass therethrough, the first diaphragm separating spaces inside and outside the charged particle optical lens column, the sample being observed using the sample observation device by irradiating the primary charged particle beam on the sample, the sample stage unit comprising:
a second diaphragm allowing the primary charged particle beam to be transmitted thereby or pass therethrough;
a holding member holding the second diaphragm;
a sample platform on which the holding member holding the second diaphragm is mounted, wherein
the sample is held in a space formed by the second diaphragm, the holding member, and the sample platform,
the first diaphragm and the second diaphragm are separated with each other across the space outside the charged particle optical lens column,
the space in which the sample is held is isolated by the second diaphragm, and
the irradiating the primary charged particle beam on the sample is performed in a state that a pressure in the space holding the sample is kept larger than a pressure in the space inside the charged particle optical lens column.

8. The sample stage unit according to claim 7, comprising a member for limiting a minimum distance between the first diaphragm and the second diaphragm.

9. The sample stage unit according to claim 7, wherein a plurality of the second the diaphragms are arranged on the sample platform.

10. The sample stage unit according to claim 7, wherein the sample platform holding the sample includes an opening for introducing the sample, in a surface opposing to the second diaphragm.

11. The sample stage unit according to claim 7, wherein, a flow channel for the sample is included by the space formed by the second diaphragm, the holding member, and the sample platform, and holding the sample.

12. A sample observation method, comprising:
a step of a primary charged particle beam being transmitted by or passing through a first diaphragm, the primary charged particle beam being radiated by a charged particle optical lens column, the first diaphragm being provided under the charged particle optical lens column to isolate a space inside the charged particle optical lens column;
a step of the primary charged particle beam that has been transmitted by or passed through the first diaphragm passing through a space outside the charged particle optical lens column between the first diaphragm and a second diaphragm;
a step of the primary charged particle beam being transmitted by or passing through the second diaphragm;
a step of the primary charged particle beam that has been transmitted by or passed through the second diaphragm is irradiated on the sample in contact with the second diaphragm; and
a step of detecting a signal generated from the sample on which the primary charged particle beam is irradiated, wherein
the primary charged particle beam is radiated in a state that a pressure in a space in which the sample is hold is kept larger than a pressure in the space inside the charged particle optical lens column.

13. The sample observation method according to claim 12, wherein
a positional relationship between the first diaphragm and the second diaphragm is changed by moving a sample stage holding the second diaphragm and the sample, in a state in which the first diaphragm and the second diaphragm are in noncontact with each other.

14. The sample observation method according to claim 12, wherein
the sample is introduced into a space whose part is formed by the second diaphragm, in a state in which a distance between the first diaphragm and the second diaphragm is fixed.

15. The sample observation method according to claim 12, wherein
a plurality of the second diaphragms are provided,
the plurality of the second diaphragm is arranged on a sample platform, and
the sample platform is moved such that some or all of the plurality of the second diaphragms are irradiated with the primary charged particle beam that has been transmitted by or passed through the first diaphragm.

* * * * *